(12) United States Patent
Gaur et al.

(10) Patent No.: US 10,176,099 B2
(45) Date of Patent: Jan. 8, 2019

(54) USING DATA PATTERN TO MARK CACHE LINES AS INVALID

(71) Applicant: Intel Corporation, Santa Clara, CA (US)

(72) Inventors: Jayesh Gaur, Bangalore (IN); Supratik Majumder, Bangalore (IN); Zvika Greenfield, Kfar Sava (IL); Israel Diamand, Aderet (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/206,589

(22) Filed: Jul. 11, 2016

(65) Prior Publication Data

US 2018/0011790 A1 Jan. 11, 2018

(51) Int. Cl.
| | |
|---|---|
| *G06F 12/0864* | (2016.01) |
| *G06F 12/08* | (2016.01) |
| *G06F 12/0808* | (2016.01) |
| *G06F 12/0811* | (2016.01) |
| *G06F 12/0831* | (2016.01) |
| *G06F 15/78* | (2006.01) |
| *G11C 11/406* | (2006.01) |
| *G06F 12/0897* | (2016.01) |

(52) U.S. Cl.
CPC ...... *G06F 12/0808* (2013.01); *G06F 12/0811* (2013.01); *G06F 12/0831* (2013.01); *G06F 12/0864* (2013.01); *G06F 12/0897* (2013.01); *G06F 15/781* (2013.01); *G11C 11/40615* (2013.01); *G06F 2212/283* (2013.01); *G06F 2212/621* (2013.01)

(58) Field of Classification Search
CPC .......................... G06F 12/0815; G06F 15/781
See application file for complete search history.

(56) References Cited

U.S. PATENT DOCUMENTS

| | | | |
|---|---|---|---|
| 8,949,535 B1 | 2/2015 | Hunter | |
| 9,542,335 B1* | 1/2017 | Elving | G06F 12/121 |
| 2004/0008552 A1 | 1/2004 | Machimura et al. | |
| 2005/0276087 A1* | 12/2005 | Kim | G06F 11/24 |
| | | | 365/49.1 |
| 2011/0238914 A1* | 9/2011 | Hirayama | H03M 7/30 |
| | | | 711/118 |
| 2011/0238925 A1* | 9/2011 | Robinson | G06F 12/084 |
| | | | 711/141 |
| 2015/0113224 A1* | 4/2015 | Achilles | G06F 12/0891 |
| | | | 711/135 |
| 2015/0143047 A1 | 5/2015 | Hagersten et al. | |

(Continued)

OTHER PUBLICATIONS

International Search Report and Written Opinion for PCT/US2017/037470, 13 pages, dated Sep. 13, 2017.

*Primary Examiner* — Edward J Dudek, Jr.
(74) *Attorney, Agent, or Firm* — Lowenstein Sandler LLP

(57) ABSTRACT

An apparatus includes a cache controller, the cache controller to receive, from a requestor, a memory access request referencing a memory address of a memory. The cache controller may identify a cache entry associated with the memory address, and responsive to determining that a first data item stored in the cache entry matches a data pattern indicating cache entry invalidity, read a second data item from a memory location identified by the memory address. The cache controller may then return, to the requestor, a response comprising the second data item.

21 Claims, 14 Drawing Sheets

(56) References Cited

U.S. PATENT DOCUMENTS

| | | |
|---|---|---|
| 2015/0186282 A1 | 7/2015 | Rahme et al. |
| 2015/0261683 A1 | 9/2015 | Hong et al. |
| 2015/0347254 A1* | 12/2015 | Jones .................. G06F 11/2094 714/6.13 |
| 2016/0085681 A1* | 3/2016 | Aya ..................... G06F 12/0246 711/103 |
| 2016/0275014 A1* | 9/2016 | Lim ...................... G06F 13/385 |
| 2017/0149926 A1* | 5/2017 | Wang .................. H04L 67/2852 |
| 2017/0177479 A1* | 6/2017 | Salyers ............... G06F 12/0802 |

* cited by examiner

US 10,176,099 B2

1

USING DATA PATTERN TO MARK CACHE LINES AS INVALID

The present disclosure relates to the field of memory management and, in particular, to the use of a data pattern to mark cache lines as invalid in lieu of a validity bit.

BACKGROUND

A cache is a computer component (e.g., type of memory) that stores data such that future requests for that data can be responded to faster, thus speeding up overall accesses to cache. Data stored in a cache can include original values computed at an earlier moment in time or duplicates of original values that are stored elsewhere, such as in a far (or main) memory. If requested data is in the cache, a request can be handled by reading the cache, which is faster than reading far memory. Otherwise, the requested data is fetched from its original storage location.

DESCRIPTION OF EMBODIMENTS

Figure 1:
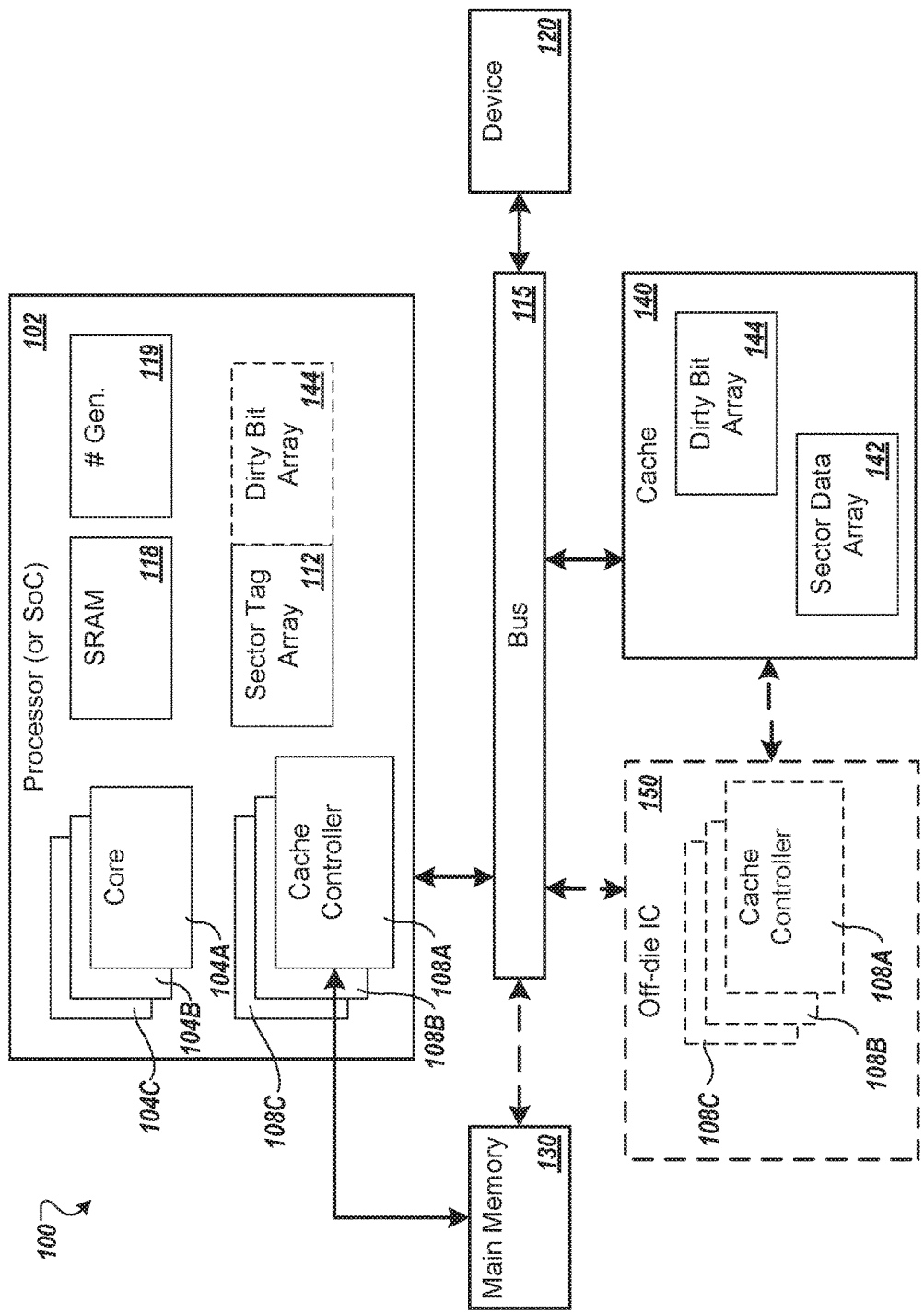
FIG. 1 is a block diagram of a system architecture that implements sector-based cache management according to an embodiment of the present disclosure.

The present disclosure relates to the field of memory management and, particularly, to the use of a data pattern to mark cache lines as invalid in memory (e.g., DRAM cache) instead of using a validity bit. Storing and retrieving from a cache creates challenges that slow down cache accesses. These challenges may be amplified with the emergence of larger caches such as High Bandwidth Memory (HBM) and LPDDR5 memory, for example, which have significantly higher bandwidths than typical dynamic random access memory (DRAM). With increasingly larger-sized DRAM caches between 2 gigabytes (GB) and 8 GB (or larger), a correspondingly larger-sized buffer or separate cache is needed to store memory management metadata such as tags, valid bits, dirty bits, and sometimes way metadata (for set-associative cache addressing) used to manage memory access requests such as reads, writes, victimizations and the like. This memory management metadata may take up too much room to feasibly be stored locally on a processor die and yet be too slow to access if stored in off-chip (e.g., off-die) memory.

As one example, management of a 4 GB set-associative cache with 38 bit addresses may require 12 bits (10 bits for tag, 1 bit for valid, and 1 bit for dirty) as metadata for memory management. This results in 96 MB worth of tag area to store the tag metadata, which is impractical to store on a central processor unit (CPU) die. Accordingly, in one embodiment, a cache may be organized with a larger block size each including a number of cache lines, thus significantly reducing tag area. These larger block sizes are referred to as super-lines or sectors, and will generally be referred as "sectors" herein.

Even with a larger sector size, however, individual cache lines still need to be validated at a cache-line granularity, e.g., for each cache line. By way of example, assuming a 4 KB sector for a 4 GB cache, the metadata per sector is 138 bits (10 bits for tag and 64 bits each for both valid and dirty bits) where there are 64 cache lines within the 4 KB sector. Organizing the cache this way reduces overall tag area to 17.25 MB, which is still too high for a practical on-die implementation. Of this 17.25 MB, only 1.25 MB is for storing address tags and the remainder is for storing 8 MB each for valid and dirty bits. Accordingly, the increase in tag area is primarily due to valid and dirty bits.

Accordingly, a sector-based cache is organized into a plurality of sectors of a certain size. Each sector may include a certain number of cache lines. In one embodiment, the address tag bits (used to indicate a physical address in main memory) can be stored on a processor die (or system-on-a-chip) in a sector tag array, as each address tag entry includes only a single valid bit to indicate validity for each sector. A sector tag array may be a data array containing address tags for sectors with corresponding valid bits for each sector (where a sector is a block of cache lines). The dirty bits are used for writes and victims, e.g., data evictions from cache when the data becomes stale. Victimized cache lines are sometimes stored in a separate victim cache to enable a way to later access victimized cache lines, if needed. Accessing dirty bits for writes and victims is not latency sensitive because data need not be retrieved and transmitted elsewhere; only a determination need be made whether to write to a cache line or to victimize the cache line before writing to the cache line. Accordingly, dirty bits may be stored off-die, e.g., in a small dirty-bit cache. Valid bits are used to determine validity of each cache line in a sector for any access request, including reads, writes, partial reads or partials writes, victims, I/O snoops and the like. Because valid bits take up 8 MB of tag area in the present example, the valid bits are not feasibly stored on-die for a large cache.

Instead of storing valid bits on-die or off-die, data matching a predetermined pattern (hereinafter referred to as a "data pattern") may be stored in invalid memory locations of a cache memory to indicate cache entry invalidity. In one embodiment, a cache controller may then receive a memory access request from a requestor such a processor core or other processing device. The memory access request may reference a memory address of the cache memory. The cache controller may identify a cache entry associated with the memory address, and responsive to determining that a data item stored in the cache entry matches the data pattern, determine that the cache entry is invalid. When invalid, the cache controller may continue by retrieving the data item from a memory location of main memory identified by the memory address. The cache controller may then return, to the requestor, a response having the data item. The cache controller may further allocate to a new cache line of the cache memory in which to store the data item. When the data item stored in the cache entry does not match the data pattern, the cache entry is valid and the cache controller may return the data item from the cache entry to the requestor.

In another embodiment, a cache controller may allocate a cache entry (e.g., decide where exactly to cache data) to a cache line in one of a plurality of sectors of a sector-based cache memory. The cache controller may, responsive to a memory access request, parse the memory access request to determine a sector address and a cache line location of a cache line including the cache entry. The cache controller may further detect an address tag (within a sector tag array) that matches a sector address referenced by the memory access request. The address tag corresponds to a sector of the plurality of sectors of the cache. Responsive to determining that the address tag matches the sector address, the cache controller may read a data item from the cache line of the sector. The cache controller may then determine whether the data item matches a data pattern that indicates the cache line is invalid. In other words, if the data item at the cache line is valid data, the data item should not match the data pattern. (Additional precautions will be discussed that may avoid allowing actual data from main memory happening to match the data pattern.) Accordingly, the cache controller may use the data item to respond to the memory access request upon determining that the data item of the sector does not match the predetermined data pattern. If the data item does match the data pattern, the cache line is invalid, and the cache controller may retrieve needed data from main memory based on a memory address of the memory access request.

This cache management approach for confirming validity may also be applied to set-associative cache where the plurality of sectors correspond to a plurality of sets of ways. Caches are generally divided into multiple equal sections called cache ways. A set-associative scheme works by grouping the cache ways into sets (see FIG. 7B), where each set corresponds to a group of main memory locations. While the addressing of set-associative cache will be explained in more detail, a sector of the set-associative cache may contain the cache lines within a numbered set and a numbered way, which may also be referred to herein as a (Set, Way).

Accordingly, a way chosen within a set corresponds to a sector within the set-associative cache that includes a number of cache lines. In this embodiment, the cache controller may allocate an entry to a cache line of a set and way of the set-associative cache. The cache controller may, responsive to a memory access request, parse the memory access request to determine a set index portion, a way address, and a cache line location of a cache entry associated with a memory address of the memory access request. The cache controller may determine a set within the set associative cache from a set index referenced by the memory access request. The cache controller may detect an address tag within a way tag array that matches a way address of the memory access request, where the address tag corresponds to a way of the set. The cache controller may further, responsive to determining that a data item stored in the cache line of the way matches a data pattern indicating cache entry invalidity, read a second data item from a memory location in main memory identified by the memory address. If the data item, however, does not match the data pattern, the cache controller may use the data item to respond to the memory access request (because the lack of match indicates valid data).

FIG. 1 is a block diagram of a system architecture 100 that implements sector-based cache management according to an embodiment of the present disclosure. The system architecture 100 may include a processor 102 coupled with a main memory 130 via a bus 115. The system architecture 100 may also include a device 120 (e.g., an I/O device or other data processing or data consuming device) coupled with the processor 102 through the bus. The system architecture 100 also includes a cache 140 interposed between the bus 115 and the main memory 130 that inspects and is able to act on memory access requests directed to the main memory 130.

The processor 102, which may also be manufactured as a system-on-a-chip, may include one or more cores 104A, 104B and 104C, for example, and a one or more cache controllers 108A, 108B and 108C, for example. The processor 102 may further include a sector tag array 112 containing address tags for sectors with corresponding valid bits for each sector. The sector tag array 112 may optionally also contain dirty bits or be attached to a dirty bit array 144 (or dirty bit cache) with dirty bits corresponding to cache lines of the sectors. With an increase in DRAM sizes, even the sector tag array 112 may become too large to store on-die of the processor 102. In this situation, the sector tag array 112 may be implemented as a local tag cache (with sector valid bits) but still implementing cache line invalidity using the data pattern in individual cache lines as disclosed herein.

The processor 102 may further include static random access memory (SRAM) 118 or other local storage in which to store the sector tag array 112, optionally the dirty bit array 144 (if on-die), and also to store any address that points to particular data in the main memory that matches the data pattern. For the latter, the particular data (on the order of a few KB) is stored independently of the sector tag array 112. The cache controller may mark this address that is stored in the SRAM as non-evictable. A cache controller may then, responsive to a memory access request containing the address, use the particular data to respond to the memory access request instead of retrieving any data from the cache 140.

The processor may also include a pseudo-random number generator 119 with which to generate a data pattern for the cache controller(s) to use in indicating cache lines as invalid. Upon reset of the system architecture 100, and thus also the processor core(s), the pseudo-random number generator 119 may generate a new data pattern for use system wide, making the present approach of indicating invalidity of cache lines more secure from malicious code. The data pattern may also be made longer, e.g., padded to some extent, so that the data pattern is more difficult to replicate and so that the probability of it matching real data is also lowered.

The processor 102 may be any type of processor, including a general purpose microprocessor, such as a processor in the Intel® Pentium® Processor Family, Intel® Xeon® Processor Family, Intel® Core™ Processor Family, or other processor family from Intel® Corporation, or another processor from another company, or a special purpose processor or microcontroller. The processor 102 may include multiple threads and multiple execution cores, in any combination. In one embodiment, the processor 102 is integrated in a single integrated circuit die having multiple hardware functional units (hereafter referred to as a multi-core system). The multi-core system may be a multi-core processor package, but may include other types of functional units than just processor cores. Functional hardware units may be processor cores, digital signal processors (DSP), image signal processors (ISP), graphics cores (also referred to as graphics units), voltage regulator (VR) phases, input/output (I/O) interfaces (e.g., serial links, DDR memory channels) and their controllers, network controllers, fabric controllers, or any combination thereof.

In one embodiment, the system architecture 100 may further include an off-die integrated circuit (IC) that includes the cache controllers 108A, 108B and 108C. The off-die IC may be any integrated circuit such as a specifically designed IC, as a field programmable gate array (FPGA), or as some other programmable device, for example.

In one embodiment, the cache 140 may include, for example, a sector data array 142 storing data that is addressed as a plurality of sectors each having a plurality of cache lines, as will be further explained. The cache 140 may also include tag metadata, which may include a dirty bit array 144 (and possibly also tags, valid bits, and the like). Storing dirty bits off-die does not significantly impact latency of performing memory access requests such as writes and victims, as a cache controller only need determine whether to write to a cache line or to victimize the cache line before writing to the cache line. Storing the dirty bit array 144 within a small off-die cache, however, may help reduce bandwidth requirements for updates to the dirty bits on writes and victims.

The main memory 130 may include any type of persistent or non-volatile media, such as a flash memory device, a solid-state device (SSD), a memristor, phase change memory (e.g., PCS, PCM, PCME, PCRAM, Ovonic Unified Memory, Chalcogenide RAM, C-RAM, etc.), or other storage or memory device. The main memory 130 stores instructions and/or data represented by data signals that are to be interpreted and/or executed by the processor 102. The processor 102 may be coupled towards the memory 130 via the bus 115. In some embodiments, the main memory 130 is a dual-inline memory module (DIMM). The main memory 130 may also include volatile memory, such as in the form of random access memory (RAM) or registers.

The device 120 may be a device (e.g., an input-output (I/O) device), a driver belonging to an I/O device, or software program capable of accessing (e.g., reading from, writing to) the main memory 130. When the device 120 is a driver, the driver may be running on the processor 102 even though the driver belongs to an I/O device. An example of the device 120 may include a graphics device or graphics driver. The device 120 may receive or be assigned a memory address, multiple memory addresses, a block of memory address, or multiple blocks of memory addresses (hereafter referred to collectively as "an address"). For example, an operating system executed by the processor 102 may assign the device 120 an address to use during operation. Alternatively, the device 120 may arbitrarily select an address from a list of available memory addresses. The device 120 may also be integrated with the processor 102 as part of a system-on-a-chip (SoC).

The cache 140 is shown as a single-level, memory-side cache (e.g., cache located away from a processor core and close to an interface leading to off-chip memory), although the techniques described may be applied to one or more levels of cache within one or more of the cores 104A, 104B or 104C, a set of one or more shared cache units to optionally include external memory such as the main memory 110. The set of shared cache units may include one or more mid-level caches, such as level 2 (L2), level 3 (L3), level 4 (L4), or other levels of cache, a last level cache (LLC), and/or combinations thereof. Any number of cache configurations and cache sizes are contemplated in which the cache is organized and addressed as a series of sectors, each sector including a number of cache lines. Depending on the architecture, the cache 140 may be a single internal cache located on an integrated circuit or may be multiple levels of internal caches on the integrated circuit. For configurations with multiple cache levels, the caches can be configured to be inclusive or non-inclusive. Other embodiments include a combination of both internal and external caches depending on particular embodiments.

The cache 140 may be configured in different schemes, generally referred to as direct mapped, fully-associative and set-associative caches. A direct-mapped scheme assigns each memory block to a specific line in the cache. A fully-associative scheme maps a memory block to any line in the cache, so parallel searches of all cache lines are required to find a match within the cache. A set-associative scheme is a hybrid between a direct-mapped scheme and a fully-associative scheme in which a memory block is assigned to a set of cache lines, so a search for that memory block can get a hit at a certain set and be found in any cache line within a matching set. For fully-associative or set-associative mapping, the cache 140 may include one or more cache ways organized within cache sets into which the cache is divided (see FIGS. 5-6, 7A-7C, and 8 for more specific embodiment to set-associative cache). Each cache way may include a metadata block that includes an address reference to actual data fetched from a main memory (e.g., a tag), and a data block (e.g., a cache line that contains data fetched from the main memory).

In one embodiment, upon reset of the system 100 (e.g., such that the cores are reset as well), the cache controller 108A, 108B, or 108C may write a data pattern into the cache lines of a plurality of sectors, indicating that all the cache lines start with an invalid status until writing different, valid data into the cache lines. The cache controller may execute a similar procedure when victimizing a sector of the cache. For example, the cache controller may write the data pattern into the cache lines of the victimized sector of the cache after victimization of that sector.

Figure 2:
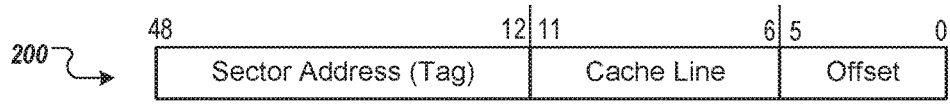
FIG. 2 is a block diagram of a memory address structure that may be used within the system of FIG. 1 to access sector-based cache according to an embodiment.

FIG. 2 is a block diagram of a memory address structure 200 that may be used within the system architecture 100 of FIG. 1 to access sector-based cache according to an embodiment. While the memory address structure of FIG. 2 includes 48 bits, this number of bits is used by way of example only and may include more or fewer than 48 bits. The memory address structure 200 may be suited for sector size of 4 KB, although different sector sizes are envisioned. The memory address structure 200 may also be a main-memory-referencing address in addition to providing sector-based cache mapping.

Accordingly, in one embodiment, the memory address structure 200 includes a sector address tag in the bit range of [48:12], a cache line location in the bit range [11:6] (corresponding to 64 B or 6 bits) specifying which cache line within a sector (e.g., which of multiple numbered cache lines), and an offset at bit range [5:0] along bits of the cache line at which to locate requested bytes of data. Use of these different portions of the memory address structure 200 to access the sectors of a large cache memory will be explained in more detail with reference to FIGS. 3A-3C.

Figure 3B:
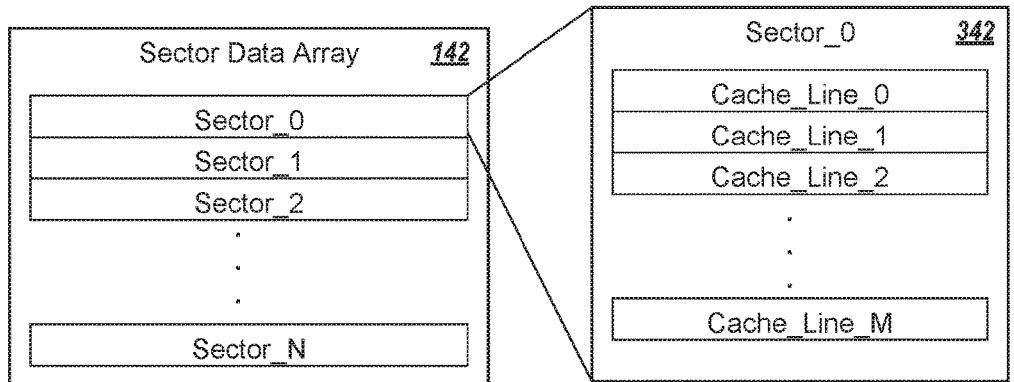
FIG. 3B is a block diagram of a sector data array used to organize sector-based cache according to an embodiment of the present disclosure.
Figure 3A:
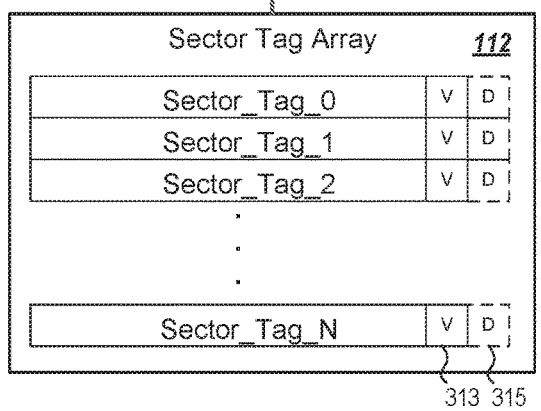
FIG. 3A is a block diagram of a sector tag array used to look up sectors within a sector-based cache according to an embodiment of the present disclosure.

FIG. 3A is a block diagram of the sector tag array 112 (FIG. 1) used to look up sectors within a sector-based cache 140 according to an embodiment of the present disclosure, where sector-based cache is cache organized by sectors. FIG. 3B is a block diagram of the sector data array 142 (FIG. 1) used to organize the sector-based cache according to an embodiment of the present disclosure. Upon receipt of a memory access request (such as a read request) including the memory address structure 200, the cache controller 108A, 108B, or 108C may parse the memory address structure to identify the sector address [48:12] and a cache line location [11:6]. The cache controller may then do a look up in the sector tag array 112 for an address tag that matches the sector address [48:12] within the memory address structure 200. Upon detecting a match (e.g., of Sector_Tag_0) within the sector tag array 112, the cache controller may check a valid bit 313 of the sector address tag, indicating whether data within the corresponding sector is valid. On a write or victimize transaction, the cache controller may access a dirty bit 315 (optionally stored with the sector tag) to determine whether the data in a referenced cache line has been modified (for writes) or is stale (for victimized transactions). A victimize transaction performs data evictions from cache when the data becomes stale.

Figure 3C:
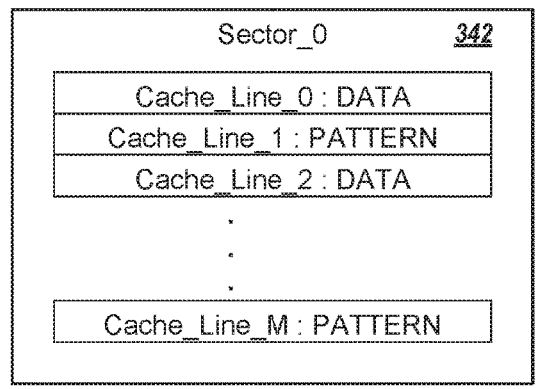
FIG. 3C is a block diagram of a particular sector of the sector data array of FIG. 3B, showing some cache lines storing data and others storing a data pattern indicative of invalidity of the cache line.

With further reference to FIG. 3B, assuming a match and the data is valid, the cache controller may access a sector 342 (e.g., Sector_0) corresponding to the sector address tag, and read data from a cache line (e.g., Cache_Line_2) corresponding to the cache line location [11:6] of the memory address structure 200. An example of data stored in Sector_0 of the cache 140 is illustrated in FIG. 3C, where some cache lines store data ("DATA") and others store a data pattern ("PATTERN") indicative of invalidity of the cache line. If the cache line read is Cache_Line_2, the cache controller uses the data for response to the memory access request because the data does not match the data pattern. If the cache line read is Cache_Line_1, however, the cache controller detects the data pattern, and knows that the data of the cache line is invalid. Accordingly, the cache controller fetches the needed data from the main memory 130 and performs a write to the cache 140, updating the dirty bits 315 and sector valid bits 313 accordingly.

Figure 4A:
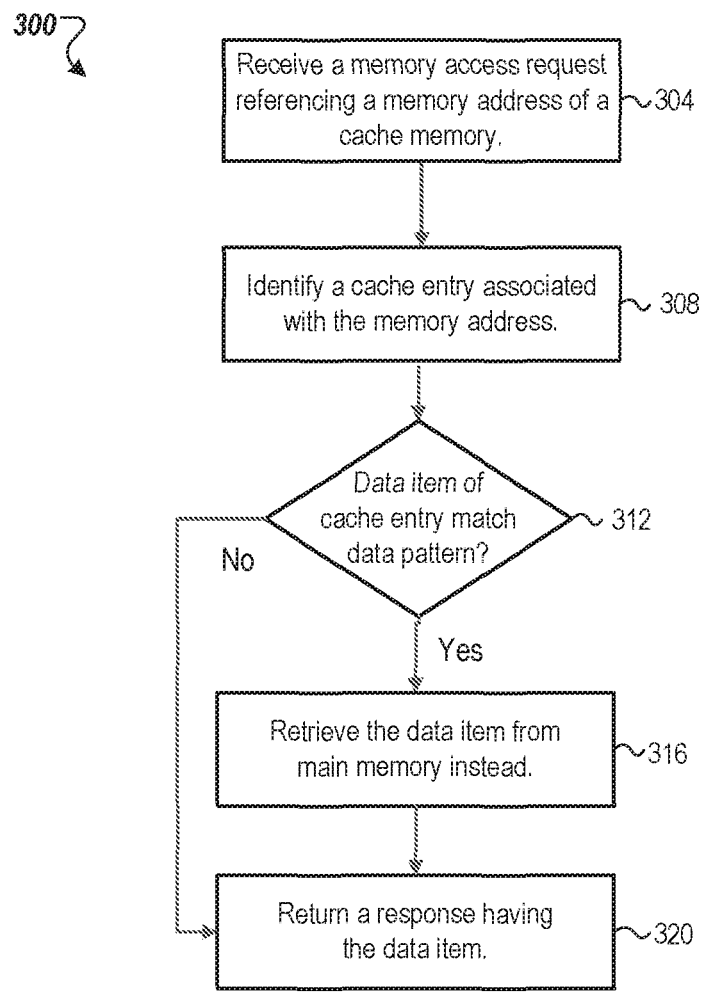
FIG. 4A is a flow diagram of a method of determining validity of data in memory locations of cache memory according to an embodiment of the present disclosure.

FIG. 4A is a flow diagram of a method 300 of determining validity of data in memory locations of cache memory according to an embodiment of the present disclosure. The method 300 may be performed by a system that may include hardware (e.g., circuitry, dedicated logic, and/or programmable logic), software (e.g., instructions executable on a computer system to perform hardware simulation), or a combination thereof. In an illustrative example, the method 300 may be performed by the processor 102 of FIG. 1. More particularly, the cache controller 108A, 108B or 108C of the processor 102 may perform the method 300. The method 00 and/or each of its functions, routines, subroutines, or operations may be performed by one or more processors of a computing system such as a computing system that shares aspects of the system architecture. Two or more functions, routines, subroutines, or operations of the method 300 may be performed in parallel or in an order which may differ from the order described above.

Referring to FIG. 4A, the method 300 may start where the cache controller receives, from a requester, a memory access request referencing a memory address of a cache memory (304). The method may continue where the cache controller implementing the method may identify a cache entry associated with the memory address (308). The method may continue where the cache controller implementing the method may determine whether a data item of the cache entry matches a data pattern indicating cache entry invalidity (312). If the answer is yes in block 312, the method may continue where the cache controller may retrieve the data item instead from main memory (due to detecting invalidity of the cache entry) (316). If the answer is no at block 312, the method may continue where the cache controller returns the data item to requestor (due to detecting the validity of the cache entry) (320).

Figure 4B:
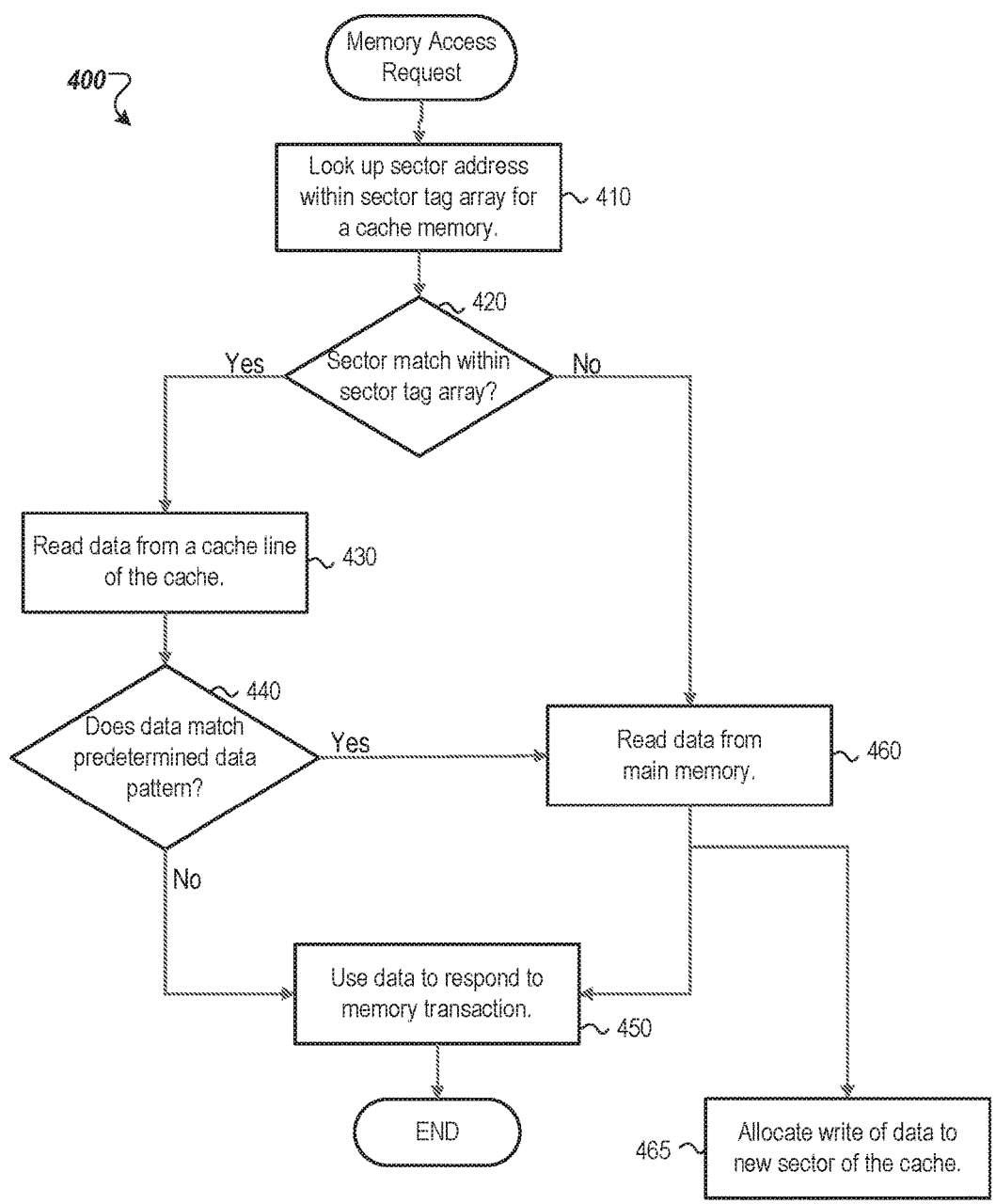
FIG. 4B is a flow diagram of a method of determining validity of data in cache lines of a sector-based cache according to an embodiment of the present disclosure.

FIG. 4B is a flow diagram of a method 400 of determining validity of data in cache lines of a sector-based cache according to an embodiment of the present disclosure. The method 400 may be performed by a system that may include hardware (e.g., circuitry, dedicated logic, and/or programmable logic), software (e.g., instructions executable on a computer system to perform hardware simulation), or a combination thereof. In an illustrative example, the method 400 may be performed by the processor 102 of FIG. 1. More particularly, the cache controller 108A, 108B or 108C of the processor 102 may perform the method 400. The method 400 and/or each of its functions, routines, subroutines, or operations may be performed by one or more processors of a computing system such as a computing system that shares aspects of the system architecture. Two or more functions, routines, subroutines, or operations of the method 400 may be performed in parallel or in an order which may differ from the order described above.

Referring to FIG. 4B, the method 400 may start where the cache controller looks up a sector address of a memory access request within a sector tag array for a sector-based cache (or any type of cache memory) (410). The method may continue where the cache controller implementing the method may determine whether the look up within the sector tag array resulted in finding a match of an address tag within the sector tag array for the sector address, and thus was able to identify the sector where the requested data is stored (420). This determination may include a check of whether a sector valid bit indicates validity of the sector.

If the answer is yes at block 420, the cache controller may read data from a cache line of the plurality of cache lines of the sector that corresponds to a cache line location referenced by the memory access request (430). The method may continue where the cache controller implementing the method may determine whether the data matches a data pattern that indicates the cache line is invalid (440). If the answer is no, the data does not match the pattern, the method may continue where the cache controller implementing the method may use the data to respond to the memory access request (450). In one embodiment, the response may be to transmit the first data to a requesting processor core or other computing device.

If the look up of the sector tag array in block 420 results in a miss or the data matches the data pattern in block 440 (and is thus invalid), the method may continue where the cache controller implementing the method may retrieve the data from main memory due to the data not being present in the cache, or to the cache entry of the data being invalid, respectively (460). The method may continue where the cache controller implementing the method may use the data from the main memory to respond to the memory access request (450). The method may continue where the cache controller implementing the method may also allocate a write of the data retrieved from the main memory to a new sector of the cache (465). In doing so, the cache controller may write the data to a first cache line of a plurality of cache lines in a new sector and may write the data pattern to a plurality of second cache lines of the plurality of cache lines of the new sector, as an indication that the plurality of second cache lines are now invalid.

Figure 5:
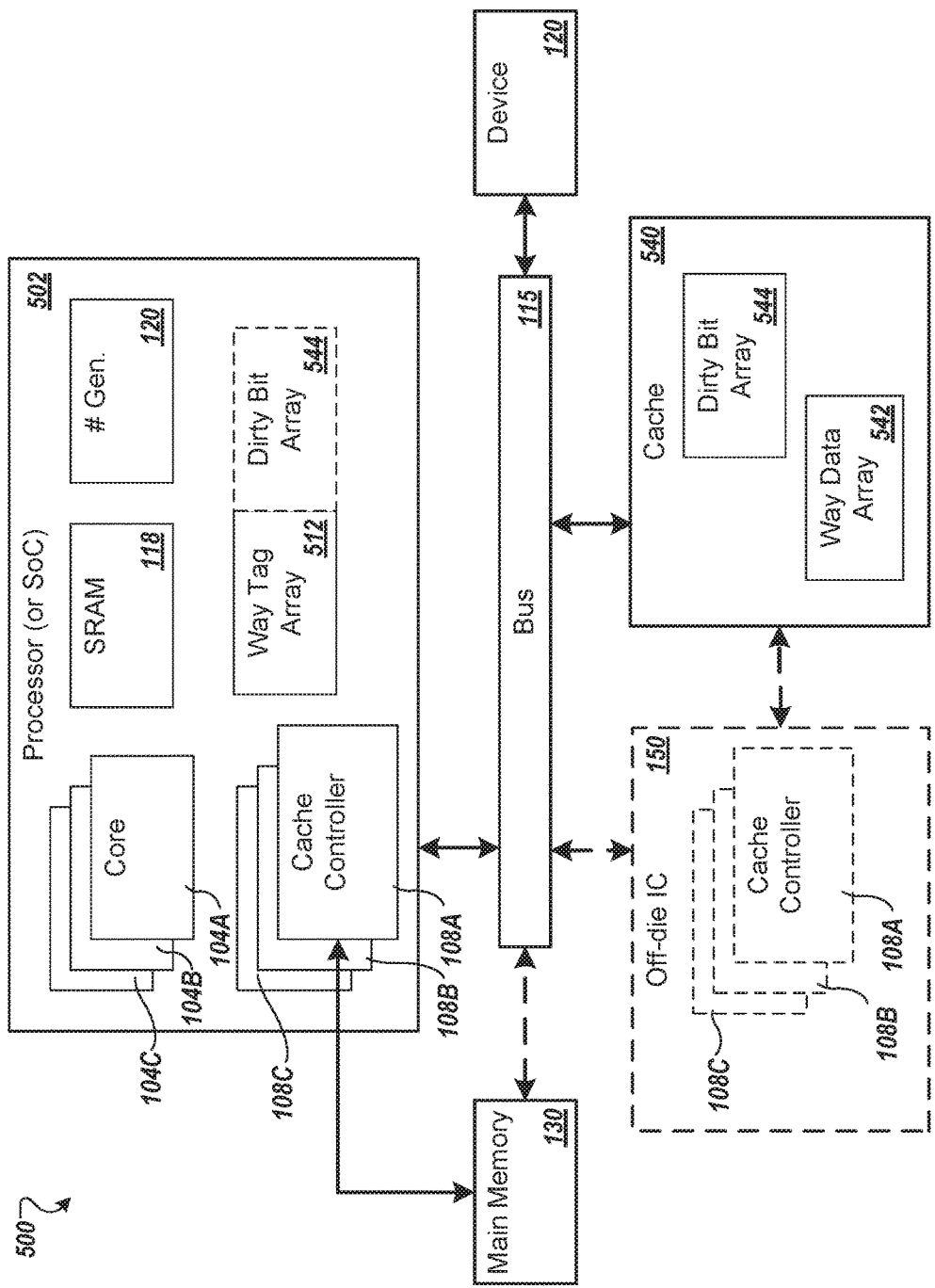
FIG. 5 is a block diagram of a system architecture that implements set-associative cache management according to an embodiment of the present disclosure.

FIG. 5 is a block diagram of a system architecture 500 that implements set-associative cache management according to an embodiment of the present disclosure. The block diagram of FIG. 5 includes a number of corresponding structures to the system architecture 100 of FIG. 1; accordingly, corresponding discussion of these structures will not be repeated except to explain the embodiment related to set-associative cache management. The system architecture 500, accordingly, may include a processor 502, a cache 540 organized as set-associative cache, main memory 130, a bus 115 and one or more device 120.

Figure 7B:
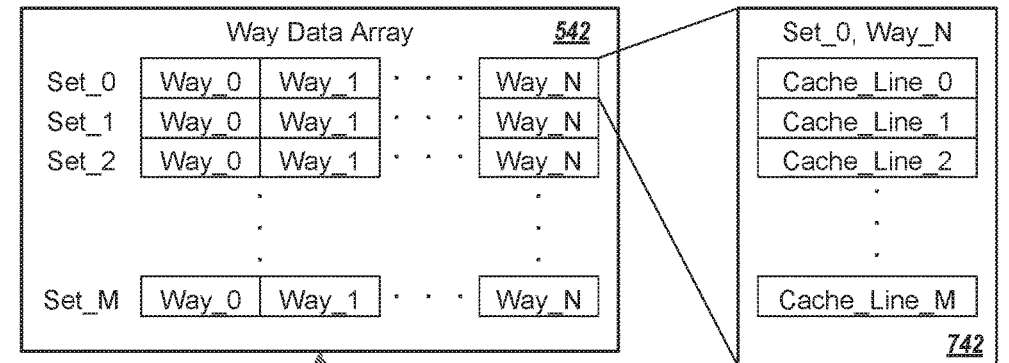
FIG. 7B is a block diagram of a way data array in which is stored cached data according to Sets and Ways of a set-associative cache according to an embodiment.

Set-associative cache is a hybrid between a fully associative cache and direct-mapped cache. Caches are generally divided into multiple equal sections called cache ways. A set-associative scheme works by grouping the cache ways into sets, where each set corresponds to a group of main memory locations as illustrated in FIG. 7B. In this manner, the ways (e.g., Way_0 through Way_N) may be distributed across the sets (e.g., Set_0 through Set_M) of the cache. To illustrate, the main memory 130 can have 1000 memory locations and may be divided into four sets. A first set of the main memory locations can include locations 1-250, a second set of the main memory locations may include locations 251-500, and so forth. The set-associative cache may have 200 ways that can be grouped into 4 sets of 50 ways, where each set of ways corresponds to a group of main memory locations. For example, a first set of ways can include 50 ways in which data from any of the first set of the main memory locations (memory locations 1-250) can be stored.

A set-associative scheme is considered a reasonable compromise between the resource-intensive hardware needed for fully associative caches (which requires parallel searches of all ways) and the simplistic direct-mapped scheme, which may cause collisions of addresses to the same way (similar to collisions in a hash table). The fewer ways needed to be searched, the less hardware is required. Some choices, therefore, may include 4-way or 8-way associative caches in which sets are groups of four or eight Ways, respectively. So, in a cache with 128 ways and 8 ways per set, there are 16 sets, for example, which may be numbered 0 to 15. An individual way within the cache may be referenced by the set number and by the way within the Set, for example "Set 14, Way 5," or may be written as (Set 14, Way 5) herein. In the present disclosure, a (Set, Way) block may also correspond to a sector as that term is used with reference to FIGS. 1-2, 3A-3C, and 4.

With continued reference to FIG. 5, the processor 502 may include a way tag array 512 in which is stored way metadata, including way address tags (which may be used to derive the address in main memory which is to be cached by a particular way) and optionally dirty bits from a dirty bit array 544 (which indicate that the data in the way data storage associated with that address in main memory has been modified since being read from main memory and will need to be copied back to main memory at some point). The dirty bit array 544 may also be stored separately (outside of the way tag array 512) and may be stored off-die. In one embodiment, the way tag array 512 is stored in a local cache of the processor 102 if the cache 540 (such as DRAM cache) is so large that the way tag array 512 is too large to be stored in its entirety on-die. Memory transactions from the processor 502 or the device 120 that are directed to main memory 130 pass through the cache 540.

In one embodiment, the cache 540 may include a way data array 542 in which are stored a number of data arrays organized according to a set-associative cache mapping, including a plurality of sets of ways of cache lines. The cache 540 may also include the dirty bit array 544, which is one embodiment, may be stored in a small, dirty-bit cache that is accessed during write or victim memory access requests.

Figure 6:
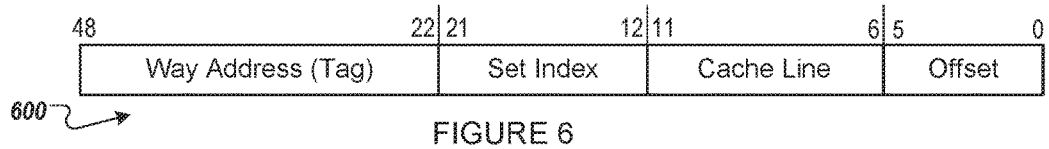
FIG. 6 is a block diagram of a memory address structure that may be used within the system of FIG. 5 to access set-associative cache according to an embodiment.

FIG. 6 is a block diagram of a memory address structure 600 that may be used within the system of FIG. 5 to access set-associative cache according to an embodiment. While the memory address structure of FIG. 6 includes 48 bits, this number of bits is used by way of example only and may include more or fewer than 48 bits. The memory address structure 600 may be suited for a sector size of 4 KB (recalling that a sector corresponds to any set and way of the set-associative cache), although different sector sizes are envisioned. The memory address structure 600 may also be a main-memory-referencing address in addition to providing (Set, Way), sector-based cache mapping.

Accordingly, in one embodiment, the memory address structure 600 includes a way address (or way address tag) in the bit range [48, 22] (which may also correspond to a main memory location), a Set index in the bit range [21:12] corresponding to a specific set, a cache line location in the bit range [11:6] delineating a specific cache line, and an offset at bit range [5:0] at which to locate requested bytes of data. Use of these different portions of the memory address structure 600 to access the sectors of a large cache memory will be explained in more detail with reference to FIGS. 7A-7C.

Figure 7A:
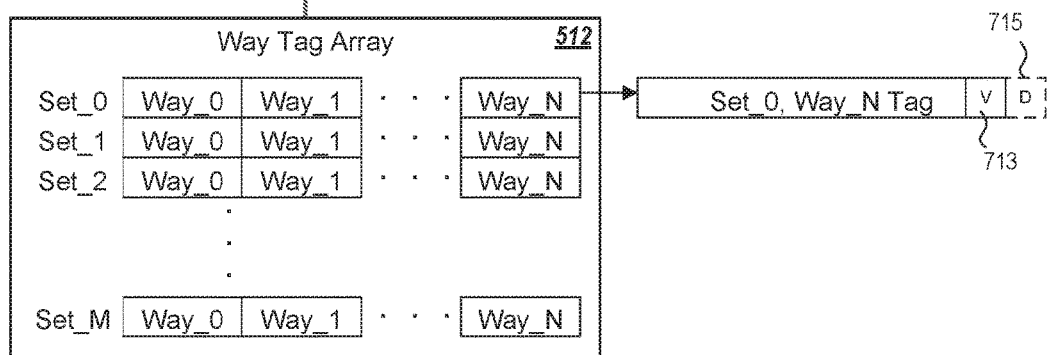
FIG. 7A is a block diagram of way tag array used to look up a set and way within a set-associative cache according to an embodiment.

FIG. 7A is a block diagram of way tag array 512 used to look up a set and way within a set-associative cache according to an embodiment. FIG. 7B is a block diagram of a way data array 542 in which is stored cached data according to sets and ways of a set-associative cache according to an embodiment. Consider the example where a read transaction is sent towards main memory 130 from the processor 502 or the device 120. The cache controller 108A, 108B or 108C may first see the read transaction. The cache controller may then derive the set of cache ways applicable to the read transaction from a main-memory-referencing address supplied with the read transaction, which in the present example, includes referencing the set index at bit range [21:12]. For example, the cache controller reads the set index to determine the set of cache ways at which to search. Suppose, for purposes of explanation, that referencing the set results in deriving Set_0 in the present example.

With reference to FIG. 7A, the cache controller 108A, 108B, or 108C may then retrieve, from the way tag array 512, the tag information pertaining to the ways of the derived set, e.g., the row of ways following Set_0. The cache controller may compare the tag (e.g., the way address tag at bit range [48:22] of the memory address structure 600) with the tags of the ways of Set_0 to determine whether a copy of the data stored in main-memory at the main-memory-referencing address supplied with the read transaction is held by one of the ways of the derived set. Upon detecting a hit of the way tag array 512 (e.g., for Way_N for purposes of explanation), the cache controller may check a valid bit 713 for the way tag, indicating whether data within the corresponding (Set_0, Way_N) is valid at a sector level. The cache controller, however, still does not know whether the data stored in any particular cache line is itself valid. On a write or victimize transaction, the cache controller may access a dirty bit 715 (optionally stored with the Set, Way tag) to determine whether the data in a referenced cache line has been modified or is stale.

With further reference to FIG. 7B, if a copy of data is held in the derived (Set, Way), the cache controller 108A, 108B, or 108C may extract the data of this copy from a cache line of the way data array 542 (e.g., Set_0, Way_N) by referencing the cache line location at bit range [11:6] (e.g., Cache_Line_1) of the memory address structure 600, and reading bytes of data from the corresponding cache line for offset [5:0].

Figure 7C:
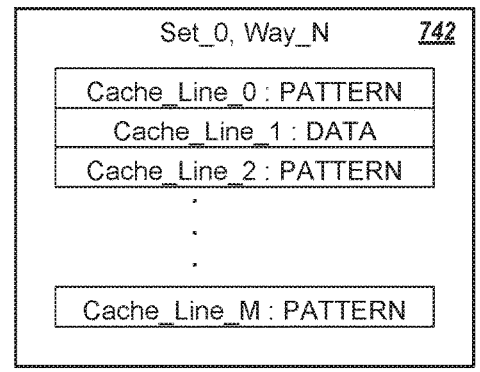
FIG. 7C is a block diagram of a set and way block of memory within the way data array of FIG. 7B, showing some cache lines storing data and others storing a data pattern indicative of invalidity of the cache line.

An example of data stored in (Set_0, Way_N) of the cache 540 is illustrated in FIG. 7C, where some cache lines store data ("DATA") and others store a data pattern ("PATTERN") indicative of invalidity of the cache line. If the cache line read is Cache_Line_1, the cache controller uses the data for response to the read transaction because the data does not match the data pattern. If the cache line read is Cache_Line_2, however, the cache controller detects the data pattern, and knows that the data of the cache line is invalid. Accordingly, the cache controller fetches the needed data from the main memory 130 and performs a write to the cache 540, updating the dirty bits 715 and valid bits 713 accordingly.

Figure 8:
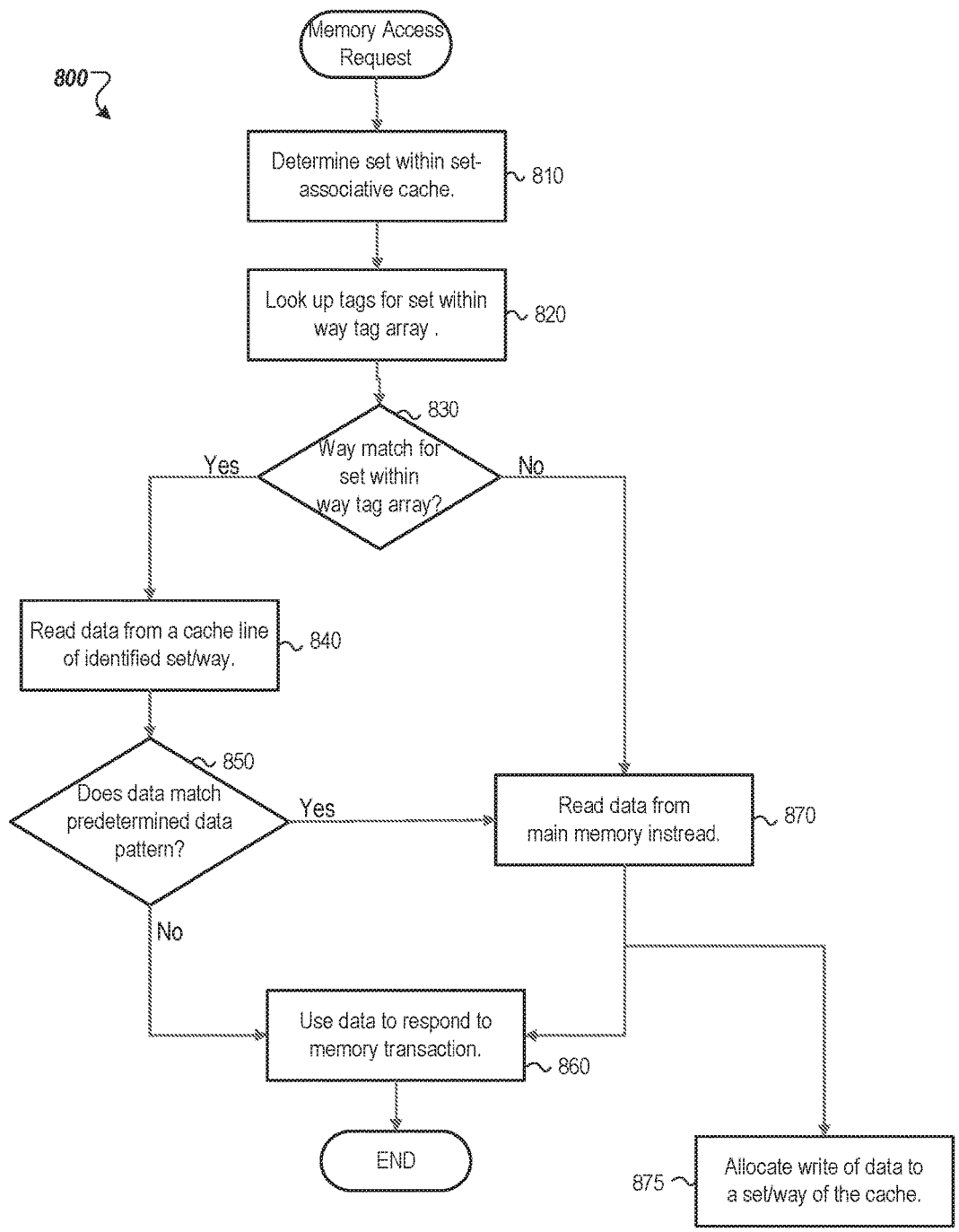
FIG. 8 is a flow diagram of a method of determining validity of data in cache lines of a set-associative cache according to an embodiment of the present disclosure.

FIG. 8 is a flow diagram of a method 800 of determining validity of data in cache lines of a set-associative cache according to an embodiment of the present disclosure. The method 800 may be performed by a process system that may include hardware (e.g., circuitry, dedicated logic, and/or programmable logic), software (e.g., instructions executable on a computer system to perform hardware simulation), or a combination thereof. In an illustrative example, the method 800 may be performed by the processor 502 of FIG. 5. More particularly, the cache controller 108A, 108B or 108C of the processor 502 may perform the method 800. The method 800 and/or each of its functions, routines, subroutines, or operations may be performed by one or more processors of a computing system such as a computing system that shares aspects of the system architecture. Two or more functions, routines, subroutines, or operations of the method 800 may be performed in parallel or in an order which may differ from the order described above.

Referring to FIG. 8, the method 800 may start where the cache controller determines a set within the set-associative cache by parsing a set index referenced by a memory access request (such as a read request) (810). The method may continue where the cache controller implementing the method may look up, within a way tag array, address tags for the set (820). The method 800 may continue where the cache controller implementing the method may determine whether the look up in the way tag array resulted in a match of an address tag with the way address of the memory access request, and thus was able to identify the (Set, Way), or sector, where addressed data is stored in the set-associative cache (830). This determination may include whether a (Set, Way) valid bit indicates validity of the (Set, Way) sector.

If the answer is yes at block 830, the cache controller may read data from a cache line of the (Set, Way) that corresponds to a cache line location referenced by the memory access request (840). The method 800 may continue where the cache controller implementing the method may determine whether the data matches a data pattern that indicates the cache line is invalid (850). If the answer is no, the data does not match the pattern, the method may continue where the cache controller implementing the method may use the data to respond to the read transaction (860). In one embodiment, the response may be to transmit the data to a requesting processor core or other computing device.

If the look up of the way tag array in block 830 results in a miss or the data matches the data pattern in block 850 (and is thus invalid), the method may continue where the cache controller implementing the method may instead read the data from main memory to retrieve addressed data (870). The method may continue where the cache controller implementing the method may use the data read from the main memory to respond to the memory access request (860). The method may continue where the cache controller implementing the method may also (or concurrently) allocate a write of the second data to a new set and way of the cache (875). In doing so, the cache controller may write the first data to a first cache line of a plurality of cache lines in a new (Set, Way) and may write the data pattern to a plurality of second cache lines of the plurality of cache lines of the new (Set, Way), as an indication that the plurality of second cache lines are now invalid.

In some circumstances, there is a possibility that the data pattern may match actual data being generated by a software program being executed by the processor 102 or 502. In this case, there is a risk of a false negative, e.g., that a cache controller will consider data invalid that is actual data. With a 64 B data pattern, the probability of valid data having the same pattern is $1/(2^{512})$. However, with some degree of chance of this occurring, a number of techniques may be used to resolve such a false negative.

In one embodiment, if the processor 102 or 502 is asking for data that matches the pattern, the cache controller 108A, 108B, or 108C may abort a write operation of the data to the cache, forcing the cache controller to fetch from the main memory 130 on each subsequent memory access.

In another embodiment, an address (or more than one address) that points to the valid data that matches the data pattern in main memory may be stored in the SRAM 118 and marked as non-evictable. In response to a memory access request containing this address, the cache controller may automatically use the data matching the data pattern to respond to the memory access request, where a copy of the data may be stored locally on the processor 102 or 502 as well, for example.

In yet another embodiment (applicable to set-associative or fully-associative caches), to avoid the actual data matching the data pattern, the cache controller can encode way information (e.g., a way identifier) into the data pattern, to generate an enhanced (different) data pattern to indicate cache line invalidity. If, in the very slight chance that actual data from main memory matches this enhanced data pattern, the cache controller may save the actual data into a different way, thus forcing the actual data to be a mismatch with a new, enhanced data pattern (with a different way identifier).

Figure 9:
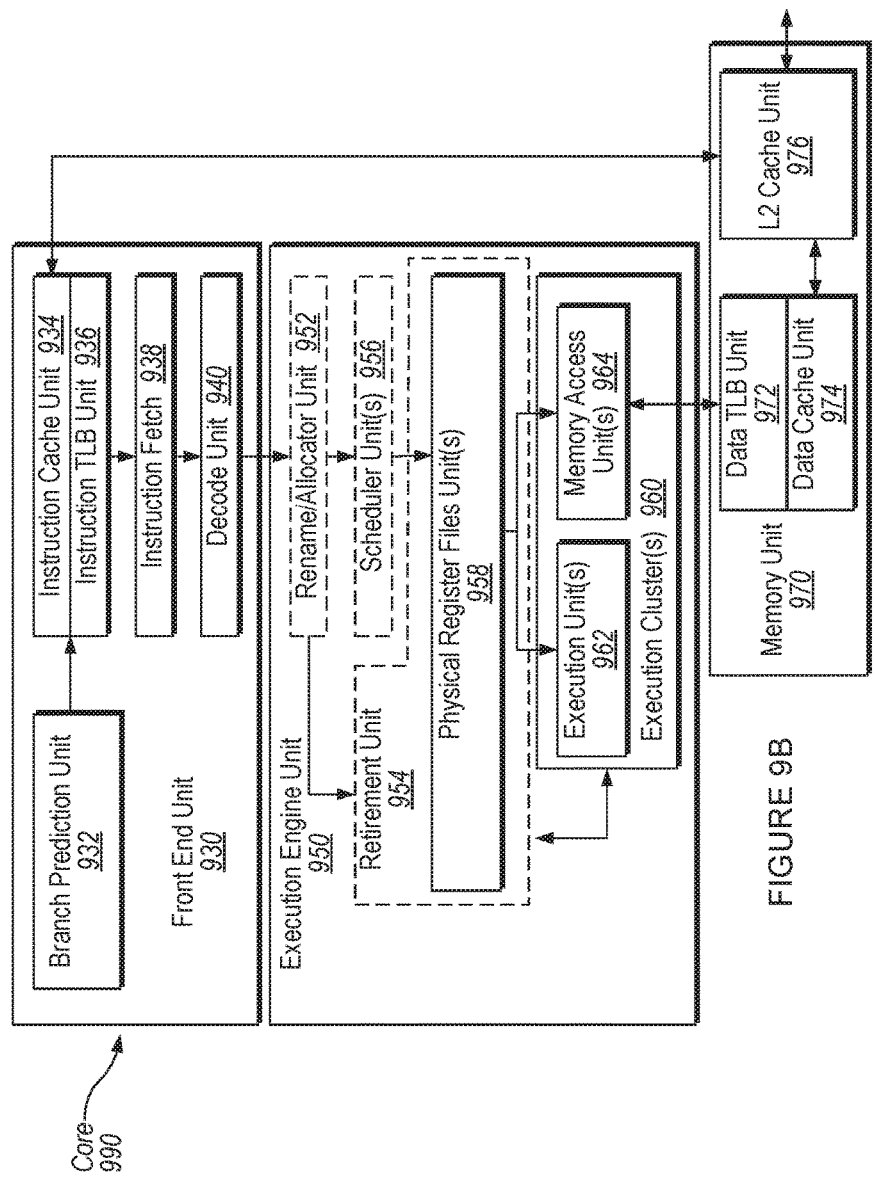
FIG. 9A is a block diagram illustrating an in-order pipeline and a register renaming stage, out-of-order issue/execution pipeline according to one embodiment.
FIG. 9B is a block diagram illustrating a micro-architecture for a processor that determines validity of data in cache lines of a sector-based cache according to one embodiment.

FIG. 9A is a block diagram illustrating a micro-architecture for a processor 900 that is used in determining validity of data in cache lines of a sector-based cache according to one embodiment. Specifically, processor 900 depicts an in-order architecture core and a register renaming logic, out-of-order issue/execution logic to be included in a processor according to at least one embodiment of the disclosure. The embodiments of the page additions and content copying can be implemented in processor 900.

Processor 900 includes a front end unit 930 coupled to an execution engine unit 950, and both are coupled to a memory unit 970. The processor 900 may include a reduced instruction set computing (RISC) core, a complex instruction set computing (CISC) core, a very long instruction word (VLIW) core, or a hybrid or alternative core type. As yet another option, processor 900 may include a special-purpose core, such as, for example, a network or communication core, compression engine, graphics core, or the like. In one embodiment, processor 900 may be a multi-core processor or may be part of a multi-processor system.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 940 may be implemented using various different mechanisms. Examples of suitable mechanisms include, but are not limited to, look-up tables, hardware implementations, programmable logic arrays (PLAs), microcode read only memories (ROMs), etc. The instruction cache unit 934 is further coupled to the memory unit 970. The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations (RS), central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 958 is overlapped by the retirement unit 954 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which may include a data prefetcher 980, a data TLB unit 972, a data cache unit (DCU) 974, and a level 2 (L2) cache unit 976, to name a few examples. In some embodiments DCU 974 is also known as a first level data cache (L1 cache). The DCU 974 may handle multiple outstanding cache misses and continue to service incoming stores and loads. It also supports maintaining cache coherency. The data TLB unit 972 is a cache used to improve virtual address translation speed by mapping virtual and physical address spaces. In one exemplary embodiment, the memory access units 964 may include a load unit, a store address unit, and a store data unit, each of which is coupled to the data TLB unit 972 in the memory unit 970. The L2 cache unit 976 may be coupled to one or more other levels of cache and eventually to a main memory.

In one embodiment, the data prefetcher 980 speculatively loads/prefetches data to the DCU 974 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 900 may support one or more instructions sets (e.g., the x86 instruction set (with some extensions that have been added with newer versions); the MIPS instruction set of Imagination Technologies of Kings Langley, Hertfordshire, UK; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor. Note that instruction cache unit 934, data cache unit 974, and L2 cache unit 976 would not generally implement the process described in this disclosure, as generally these cache units use on-die memory that does not exhibit page-locality behavior.

FIG. 9B is a block diagram illustrating an in-order pipeline and a register renaming stage, out-of-order issue/execution pipeline implemented by processor 900 of FIG. 9A according to some embodiments of the disclosure. The solid lined boxes in FIG. 9B illustrate an in-order pipeline, while the dashed lined boxes illustrates a register renaming, out-of-order issue/execution pipeline. In FIG. 9B, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924. In some embodiments, the ordering of stages 902-924 may be different than illustrated and are not limited to the specific ordering shown in FIG. 9B.

Figure 10:
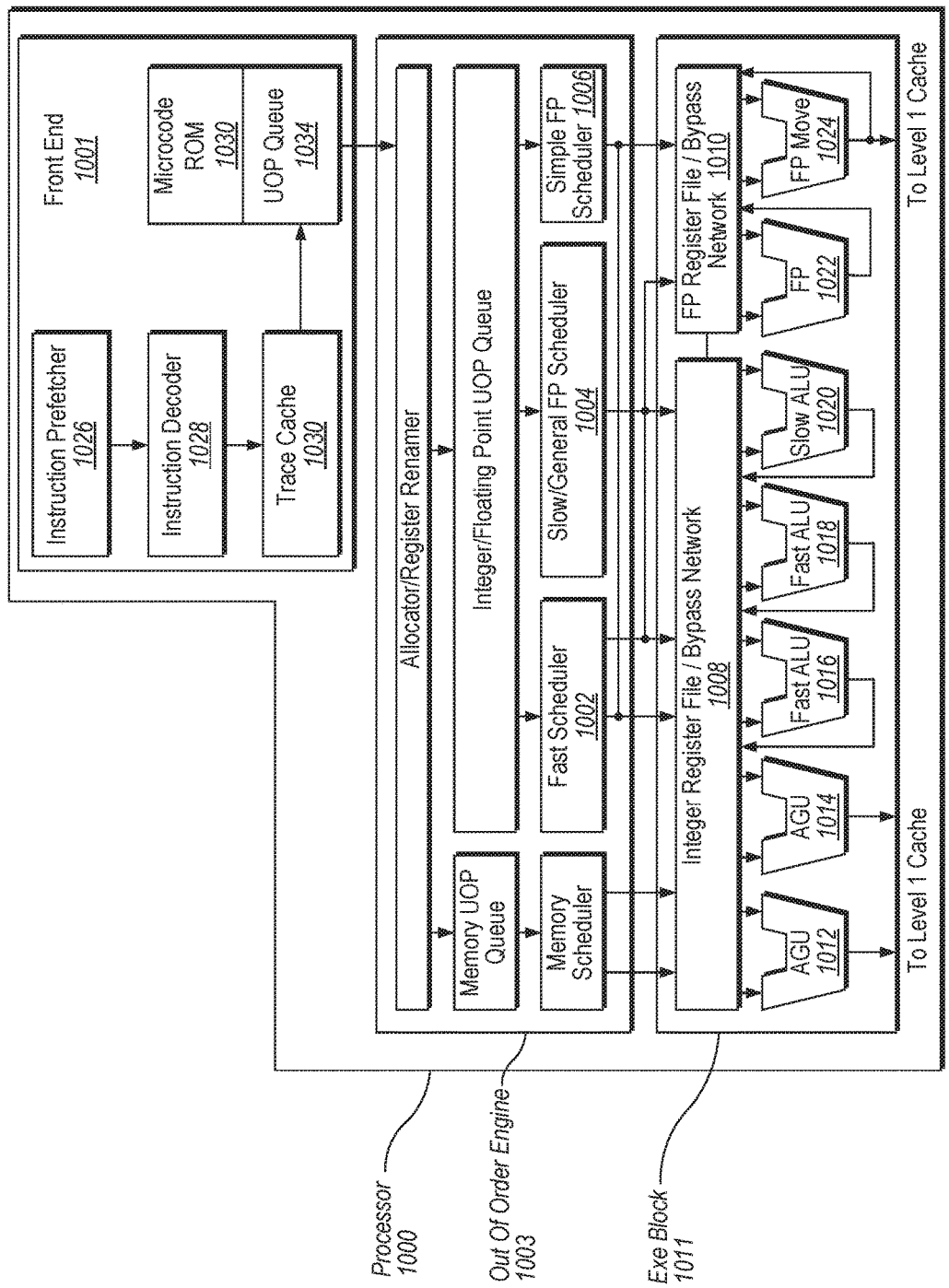
FIG. 10 illustrates a block diagram of the micro-architecture for a processor that includes logic circuits to determine validity of data in cache lines of a sector-based cache according to one embodiment.

FIG. 10 illustrates a block diagram of the micro-architecture for a processor 1000 that includes logic circuits that may be used in determining validity of data in cache lines of a sector-based cache according to one embodiment. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 1001 is the part of the processor 1000 that fetches instructions to be executed and prepares them to be used later in the processor pipeline. The embodiments of the page additions and content copying can be implemented in processor 1000.

The front end 1001 may include several units. In one embodiment, the instruction prefetcher 1016 fetches instructions from memory and feeds them to an instruction decoder 1018 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 1030 takes decoded uops and assembles them into program ordered sequences or traces in the uop queue 1034 for execution. When the trace cache 1030 encounters a complex instruction, microcode ROM (or RAM) 1032 provides the uops needed to complete the operation.

Some instructions are converted into a single micro-op, whereas others need several micro-ops to complete the full operation. In one embodiment, if more than four micro-ops are needed to complete an instruction, the decoder 1018 accesses the microcode ROM 1032 to do the instruction. For one embodiment, an instruction can be decoded into a small number of micro ops for processing at the instruction decoder 1018. In another embodiment, an instruction can be stored within the microcode ROM 1032 should a number of micro-ops be needed to accomplish the operation. The trace cache 1030 refers to an entry point programmable logic array (PLA) to determine a correct micro-instruction pointer for reading the micro-code sequences to complete one or more instructions in accordance with one embodiment from the micro-code ROM 1032. After the microcode ROM 1032 finishes sequencing micro-ops for an instruction, the front end 1001 of the machine resumes fetching micro-ops from the trace cache 1030.

The out-of-order execution engine 1003 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 1002, slow/general floating point scheduler 1004, and simple floating point scheduler 1006. The uop schedulers 1002, 1004, 1006, determine when a uop is ready to execute based on the readiness of their dependent input register operand sources and the availability of the execution resources the uops need to complete their operation. The fast scheduler 1002 of one embodiment can schedule on each half of the main clock cycle while the other schedulers can only schedule once per main processor clock cycle. The schedulers arbitrate for the dispatch ports to schedule uops for execution.

Register files 1008, 1010, sit between the schedulers 1002, 1004, 1006, and the execution units 1012, 1014, 1016, 1018, 1020, 1022, 1024 in the execution block 1011. There is a separate register file 1008, 1010, for integer and floating point operations, respectively. Each register file 1008, 1010, of one embodiment also includes a bypass network that can bypass or forward just completed results that have not yet been written into the register file to new dependent uops. The integer register file 1008 and the floating point register file 1010 are also capable of communicating data with the other. For one embodiment, the integer register file 1008 is split into two separate register files, one register file for the low order 32 bits of data and a second register file for the high order 32 bits of data. The floating point register file 1010 of one embodiment has 108 bit wide entries because floating point instructions typically have operands from 64 to 108 bits in width.

The execution block 1011 contains the execution units 1012, 1014, 1016, 1018, 1020, 1022, 1024, where the instructions are actually executed. This section includes the register files 1008, 1010, that store the integer and floating point data operand values that the micro-instructions need to execute. The processor 1000 of one embodiment is comprised of a number of execution units: address generation unit (AGU) 1012, AGU 1014, fast ALU 1016, fast ALU 1018, slow ALU 1010, floating point ALU 1012, floating point move unit 1014. For one embodiment, the floating point execution blocks 1012, 1014, execute floating point, MMX, SIMD, and SSE, or other operations. The floating point ALU 1012 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 1016, 1018. The fast ALUs 1016, 1018, of one embodiment can execute fast operations with an effective latency of half a clock cycle. For one embodiment, most complex integer operations go to the slow ALU 1020 as the slow ALU 1020 includes integer execution hardware for long latency type of operations, such as a multiplier, shifts, flag logic, and branch processing. Memory load/store operations are executed by the AGUs 1022, 1024. For one embodiment, the integer ALUs 1016, 1018, 1020, are described in the context of performing integer operations on 64 bit data operands. In alternative embodiments, the ALUs 1016, 1018, 1020, can be implemented to support a variety of data bits including 16, 32, 128, 256, etc. Similarly, the floating point units 1022, 1024, can be implemented to support a range of operands having bits of various widths. For one embodiment, the floating point units 1022, 1024, can operate on 128 bits wide packed data operands in conjunction with SIMD and multimedia instructions.

In one embodiment, the uops schedulers 1002, 1004, 1006, dispatch dependent operations before the parent load has finished executing. As uops are speculatively scheduled and executed in processor 1000, the processor 1000 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 1000 also includes logic to determine validity of data in cache lines of a sector-based cache according to one embodiment. In one embodiment, the processor 1000 may include cache 140 or 540 to determine validity of data in cache lines of a sector-based cache according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 11:
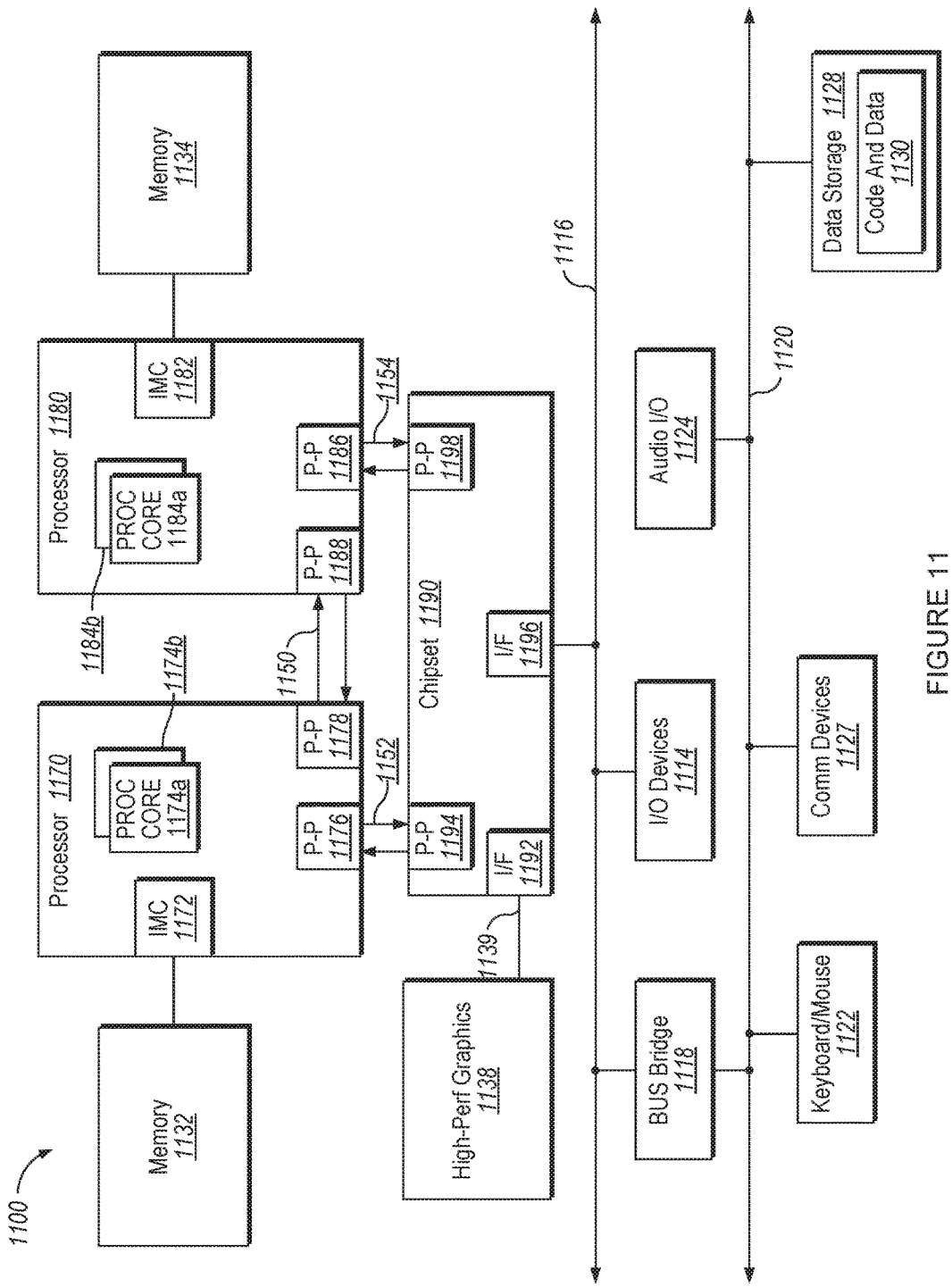
FIG. 11 is a block diagram of a computer system according to one implementation.

Embodiments may be implemented in many different system types. Referring now to FIG. 11, shown is a block diagram of a multiprocessor system 1100 in accordance with an implementation. As shown in FIG. 11, multiprocessor system 1100 is a point-to-point interconnect system, and includes a first processor 1170 and a second processor 1180 coupled via a point-to-point interconnect 1150. As shown in FIG. 11, each of processors 1170 and 1180 may be multicore processors, including first and second processor cores (i.e., processor cores 1174a and 1174b and processor cores 1184a and 1184b), although potentially many more cores may be present in the processors.

While shown with two processors 1170, 1180, it is to be understood that the scope of the present disclosure is not so limited. In other implementations, one or more additional processors may be present in a given processor.

Processors 1170 and 1180 are shown including integrated memory controller units 1172 and 1182, respectively. Processor 1170 also includes as part of its bus controller units point-to-point (P-P) interfaces 1176 and 1188; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors. The cache 140 or 540 of FIGS. 1 and 5 may be integrated into the IMC 1372 and/or the IMC 1382 as memory-side cache, in which to determine validity of data in cache lines of a sector-based cache according to another embodiment of the present disclosure.

Processors 1170, 1180 may each exchange information with a chipset 1190 via individual P-P interfaces 1152, 1154 using point to point interface circuits 1176, 1194, 1186, 1198. Chipset 1190 may also exchange information with a high-performance graphics circuit 1138 via a high-performance graphics interface 1139.

A shared cache (not shown) may be included in either processor or outside of both processors, yet connected with the processors via P-P interconnect, such that either or both processors' local cache information may be stored in the shared cache if a processor is placed into a low power mode. Page locality may also be created in the shared cache across one or more cache controllers when allocating entries to the shared cache.

Chipset 1190 may be coupled to a first bus 1116 via an interface 1196. In one embodiment, first bus 1116 may be a Peripheral Component Interconnect (PCI) bus, or a bus such as a PCI Express bus or interconnect bus, although the scope of the present disclosure is not so limited.

Figure 12:
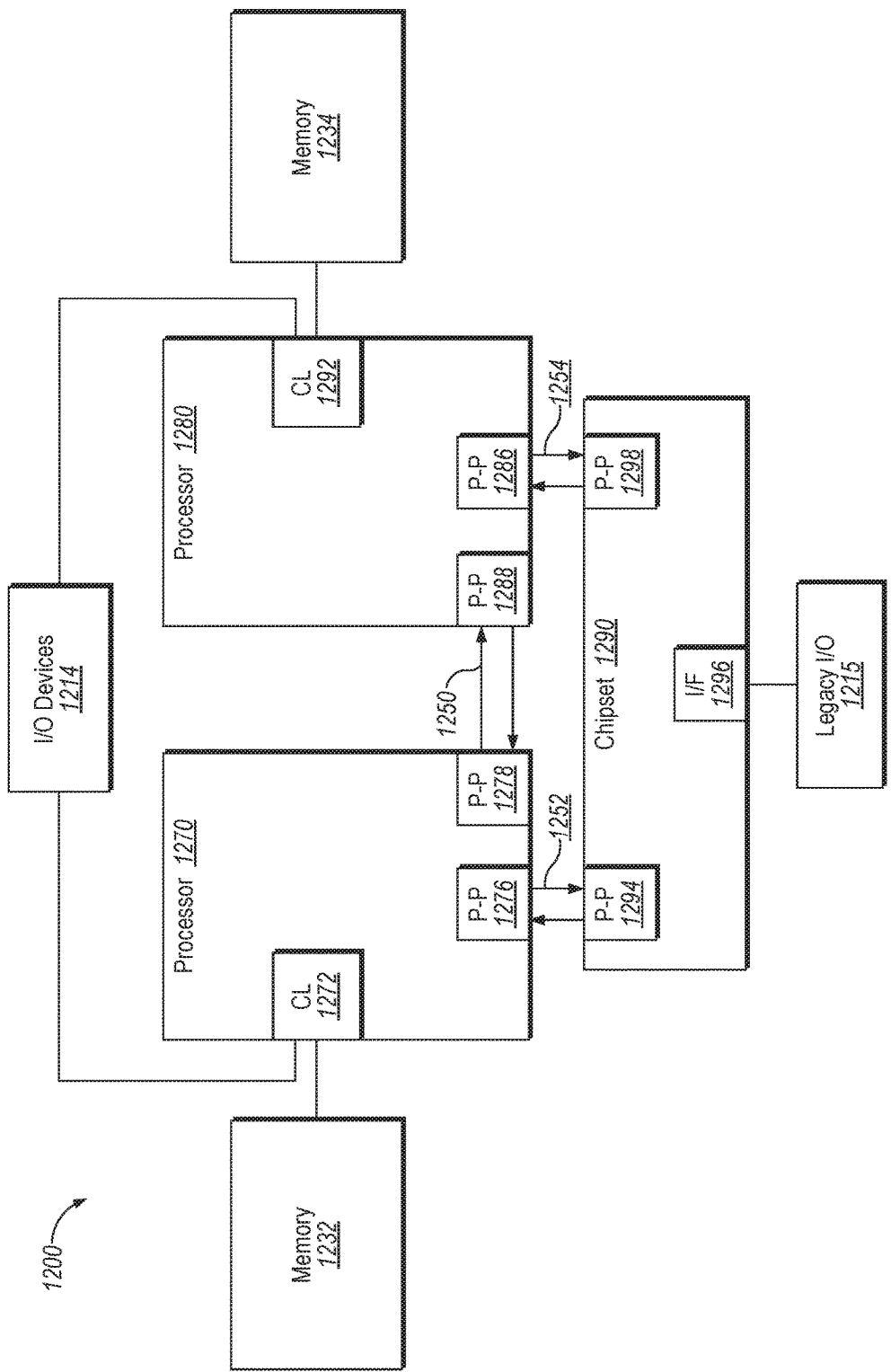
FIG. 12 is a block diagram of a computer system according to another implementation.

Referring now to FIG. 12, shown is a block diagram of a third system 1200 in accordance with an embodiment of the present disclosure. Like elements in FIGS. 11 and 12 bear like reference numerals, and certain aspects of FIG. 12 have been omitted from FIG. 11 in order to avoid obscuring other aspects of FIG. 12.

FIG. 12 illustrates that the processors 1270, 1280 may include integrated memory and I/O control logic ("CL") 1272 and 1292, respectively. For at least one embodiment, the CL 1272, 1282 may include integrated memory controller units such as described herein. In addition. CL 1272, 1292 may also include I/O control logic. FIG. 12 illustrates that the memories 1232, 1234 are coupled to the CL 1272, 1292, and that I/O devices 1214 are also coupled to the control logic 1272, 1292. Legacy I/O devices 1215 are coupled to the chipset 1290. The cache 140 or 540 of FIGS. 1 and 5 may be integrated into the CL 1272 and/or the CL 1292 as memory-side cache, in which to determine validity of data in cache lines of a sector-based cache according to another embodiment of the present disclosure.

Figure 13:
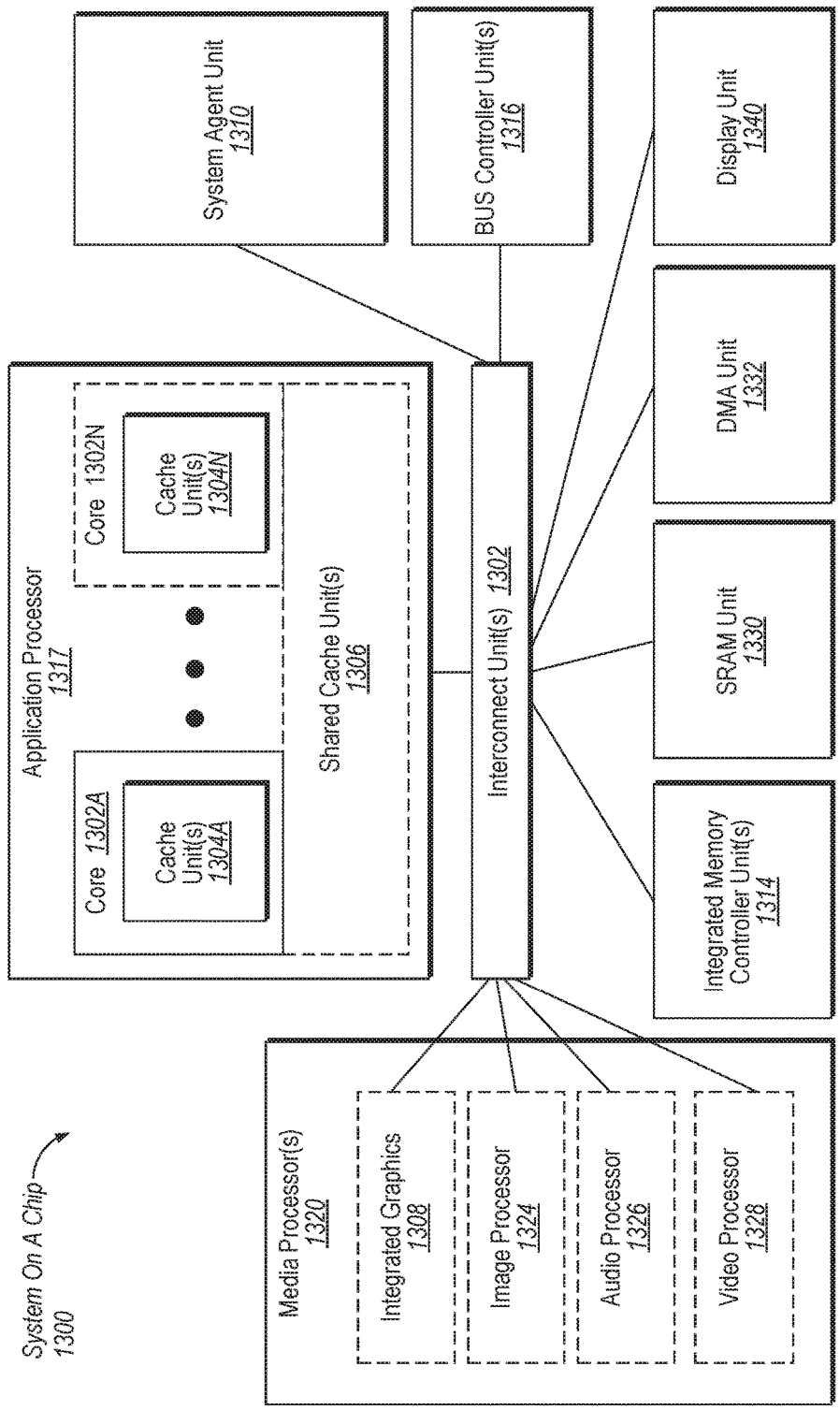
FIG. 13 is a block diagram of a system-on-a-chip according to one implementation.

FIG. 13 is an exemplary system on a chip (SoC) 1300 that may include one or more of the cores 1302. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Within the exemplary SoC 1300 of FIG. 13, dashed lined boxes are features on more advanced SoCs. An interconnect unit(s) 1302 may be coupled to: an application processor 1317 which includes a set of one or more cores 1302A-N and shared cache unit(s) 1306; a system agent unit 1310; a bus controller unit(s) 1316; an integrated memory controller unit(s) 1314; a set or one or more media processors 1320 which may include integrated graphics logic 1308, an image processor 1324 for providing still and/or video camera functionality, an audio processor 1326 for providing hardware audio acceleration, and a video processor 1328 for providing video encode/decode acceleration; a static random access memory (SRAM) unit 1330; a direct memory access (DMA) unit 1332; and a display unit 1340 for coupling to one or more external displays.

Figure 14:
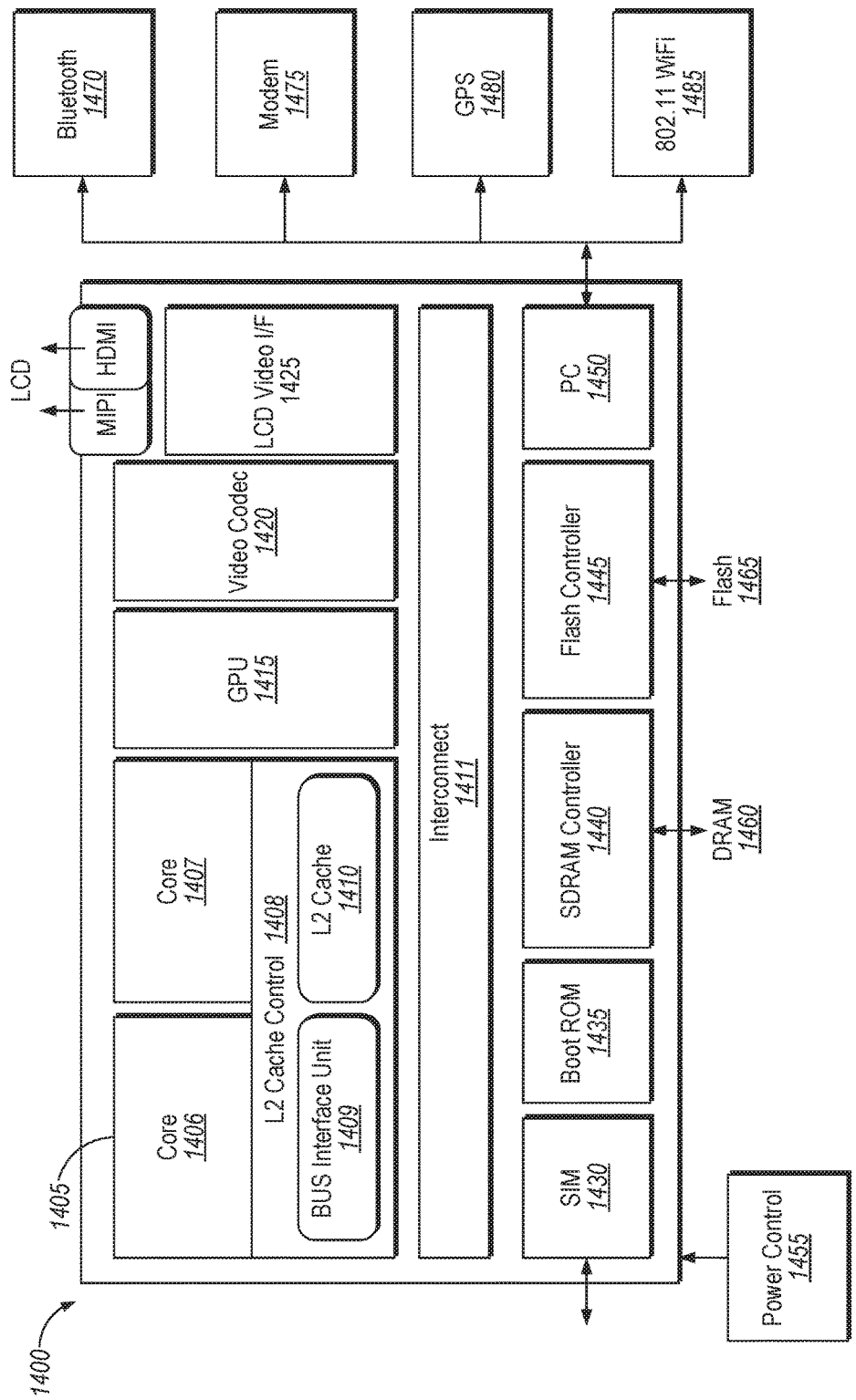
FIG. 14 illustrates another implementation of a block diagram for a computing system.

Turning next to FIG. 14, an embodiment of a system on-chip (SoC) design in accordance with embodiments of the disclosure is depicted. As an illustrative example, SoC 1400 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network. The embodiments of the page additions and content copying can be implemented in SoC 1400.

Here, SoC 1400 includes 2 cores—1406 and 1407. Similar to the discussion above, cores 1406 and 1407 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1406 and 1407 are coupled to cache control 1408 that is associated with bus interface unit 1409 and L2 cache 1410 to communicate with other parts of system 1400. Interconnect 1411 includes an on-chip interconnect, such as an IOSF, AMBA, or other interconnects discussed above, which can implement one or more aspects of the described disclosure.

In one embodiment, SDRAM controller 1440 may connect to interconnect 1411 via cache 125. Interconnect 1411 provides communication channels to the other components, such as a Subscriber Identity Module (SIM) 1430 to interface with a SIM card, a boot ROM 1435 to hold boot code for execution by cores 1406 and 1407 to initialize and boot SoC 1400, a SDRAM controller 1440 to interface with external memory (e.g. DRAM 1460), a flash controller 1445 to interface with non-volatile memory (e.g. Flash 1465), a peripheral control 1450 (e.g. Serial Peripheral Interface) to interface with peripherals, video codecs 1420 and Video interface 1425 to display and receive input (e.g. touch enabled input), GPU 1415 to perform graphics related computations, etc. Any of these interfaces may incorporate aspects of the embodiments described herein.

In addition, the system illustrates peripherals for communication, such as a Bluetooth module 1470, 3G modem 1475, GPS 1480, and Wi-Fi 1485. Note as stated above, a UE includes a radio for communication. As a result, these peripheral communication modules may not all be included. However, in a UE some form of a radio for external communication should be included.

Figure 15:
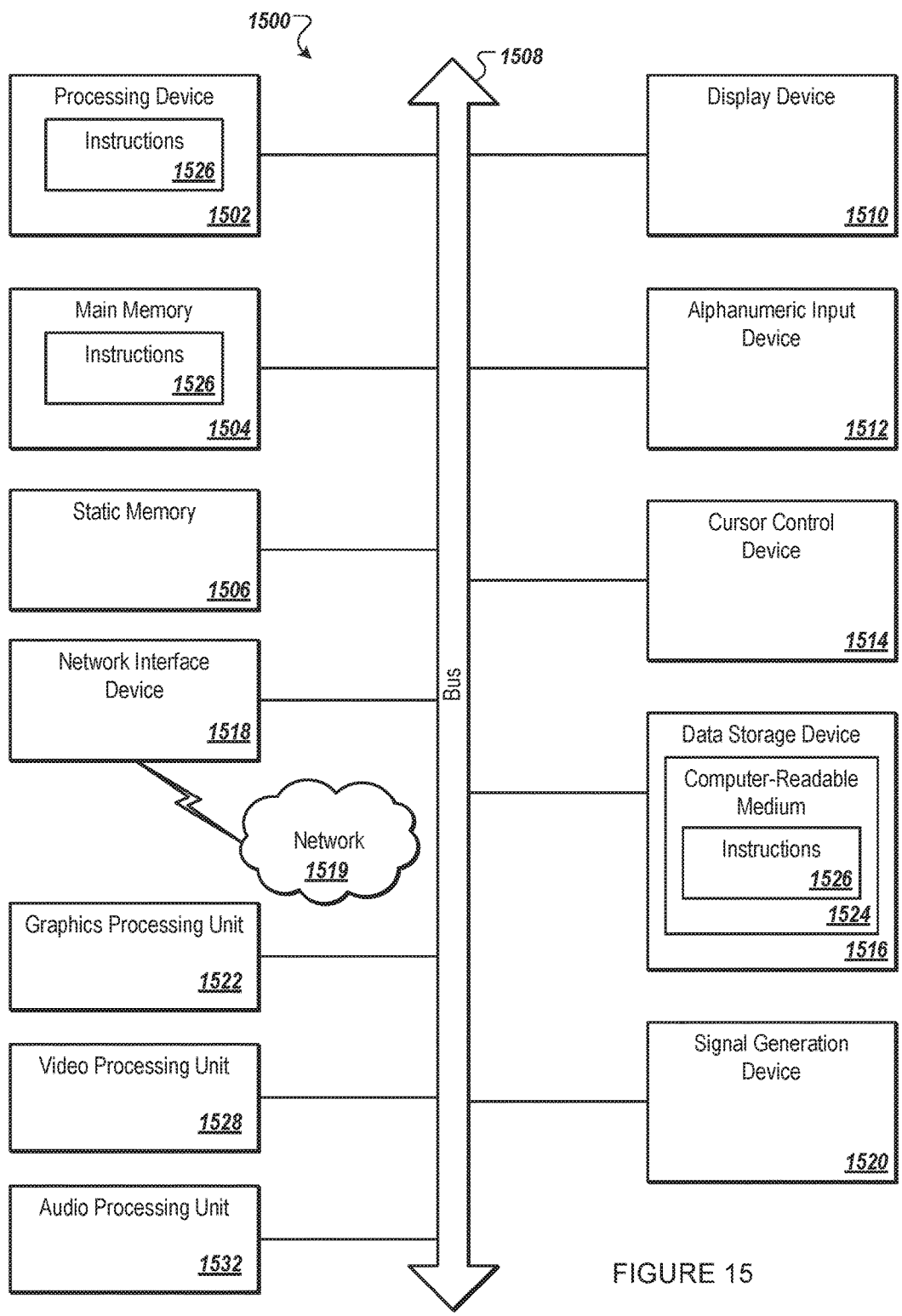
FIG. 15 illustrates another implementation of a block diagram for a computing system.

FIG. 15 illustrates a diagrammatic representation of a machine in the example form of a computing system 1500 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The embodiments of the page additions and content copying can be implemented in computing system 1500.

The computing system 1500 includes a processing device 1502, main memory 1504 (e.g., flash memory, dynamic random access memory (DRAM) (such as synchronous DRAM (SDRAM) or DRAM (RDRAM), etc.), a static memory 1506 (e.g., flash memory, static random access memory (SRAM), etc.), and a data storage device 1518, which communicate with each other via a bus 1508.

Processing device 1502 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1502 may also be one or more special-purpose processing devices such as an application specific integrated circuit (ASIC), a field programmable gate array (FPGA), a digital signal processor (DSP), network processor, or the like. In one embodiment, processing device 1502 may include one or processor cores. The processing device 1502 is configured to execute the processing logic 1526 for performing the operations discussed herein.

In one embodiment, processing device 1502 can be part of the computing system architecture 100 of FIG. 1. Alternatively, the computing system 1500 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1500 may further include a network interface device 1518 communicably coupled to a network 1519. The computing system 1500 also may include a video display device 1510 (e.g., a liquid crystal display (LCD) or a cathode ray tube (CRT)), an alphanumeric input device 1510 (e.g., a keyboard), a cursor control device 1514 (e.g., a mouse), a signal generation device 1520 (e.g., a speaker), or other peripheral devices. Furthermore, computing system 1500 may include a graphics processing unit 1522, a video processing unit 1528 and an audio processing unit 1532. In another embodiment, the computing system 1500 may include a chipset (not illustrated), which refers to a group of integrated circuits, or chips, that are designed to work with the processing device 1502 and controls communications between the processing device 1502 and external devices. For example, the chipset may be a set of chips on a motherboard that links the processing device 1502 to very high-speed devices, such as main memory 1504 and graphic controllers, as well as linking the processing device 1502 to lower-speed peripheral buses of peripherals, such as USB, PCI or ISA buses.

The data storage device 1518 may include a computer-readable storage medium 1524 on which is stored software 1526 embodying any one or more of the methodologies of functions described herein. The software 1526 may also reside, completely or at least partially, within the main memory 1504 as instructions 1526 and/or within the processing device 1502 as processing logic during execution thereof by the computing system 1500; the main memory 1504 and the processing device 1502 also constituting computer-readable storage media.

The computer-readable storage medium 1524 may also be used to store instructions 1526 utilizing the processing device 1502, such as described with respect to FIGS. 1, 4, 7A and 7B, and/or a software library containing methods that call the above applications. While the computer-readable storage medium 1524 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is a apparatus comprising a cache controller, the cache controller to: a) receive, from a requestor, a memory access request referencing a memory address of a memory; b) identify a cache entry associated with the memory address; c) responsive to determining that a first data item stored in the cache entry matches a data pattern indicating cache entry invalidity, read a second data item from a memory location identified by the memory address; and d) return, to the requestor, a response comprising the second data item.

In Example 2, the apparatus of Example 1, wherein the memory access request is a read request, and wherein the cache controller is further to, upon detecting that the second data item matches the data pattern, abort a write operation of the second data item to the memory.

In Example 3, the apparatus of Example 1, wherein the apparatus further comprises a static random-access memory (SRAM) to store a second address that points to a third data item in the memory, wherein the third data item matches the data pattern, and wherein the cache controller is further to: a) mark the second address as non-evictable; and b) in response to the memory access request referencing the second address, use the third data item to respond to the memory access request.

In Example 4, the apparatus of Example 1, wherein the memory comprises a plurality of sectors each of which includes a plurality of cache lines, and wherein the cache controller is further to: a) parse the memory access request to determine a sector address and a cache line location of a cache line comprising the cache entry; and b) responsive to determining that an address tag identifying a sector of the plurality of sectors matches the sector address, read the first data item from the cache line of the sector.

In Example 5, the apparatus of Example 4, further comprising a tag cache to store a sector tag array comprising address tags for the plurality of sectors and corresponding valid bits indicating sector-level validity for the plurality of sectors.

In Example 6, the apparatus of Example 4, wherein the cache controller is further to write the data pattern into the plurality of cache lines of the plurality of sectors responsive to detecting a processor reset.

In Example 7, the apparatus of Example 6, further comprising a pseudo-random number generator to generate a different data pattern for use after detecting the processor reset.

In Example 8, the apparatus of claim 4, wherein the cache controller is further to write the data pattern into the plurality of cache lines of a victimized sector of the plurality of sectors.

In Example 9, the apparatus of claim 4, wherein the memory is a set-associative cache in which the sector corresponds to a set and a way of a plurality of sets of ways of the set-associative cache.

In Example 10, the apparatus of claim 4, wherein the cache controller is further to: a) detect a miss within a sector tag array for the sector address referenced by the memory access request; b) retrieve the first data item from the memory in response to the miss; c) write the first data item to a first cache line of a plurality of cache lines in a first sector of the plurality of sectors; and d) write a data pattern to second cache lines of the plurality of cache lines of the first sector, the data pattern indicating that the second cache lines are invalid.

Various embodiments may have different combinations of the structural features described above. For instance, all optional features of the computing system described above may also be implemented with respect to the method or process described herein and specifics in the examples may be used anywhere in one or more embodiments.

Example 11 is a system on a chip (SoC) comprising: 1) a processor core; and 2) a cache controller operatively coupled to the processor core and to allocate to a cache line within a set and a way of a set-associative cache, wherein the cache controller is to, responsive to a memory access request received from the processor core: a) parse the memory access request to determine a set index portion, a way address, and a cache line location comprising a cache entry associated with a memory address of the memory access request; b) determine a set and a way within the set associative cache from, respectively, the set index portion and the way address; c) access, using the cache line location, a cache line of the set and way; d) responsive to determining that a first data item stored in the cache line matches a data pattern indicating cache entry invalidity, read a second data item from a memory location identified by the memory address; and e) return, to the processor core, a response comprising the second data item.

In Example 12, the SoC of Example 11, further comprising a local cache to store a way tag array, and wherein the cache controller is further to detect, within the way tag array, a match with the way address, wherein the way address corresponds to the way of the set.

In Example 13, the SoC of Example 12, wherein the cache controller is operatively coupled to a main memory, wherein the data pattern further includes a first way identifier of the way, and wherein the cache controller is further to: a) detect a miss within the way tag array for the way address referenced by the memory access request; b) retrieve the first data item from the main memory in response to the miss; c) detect that the first data item as stored in the main memory matches the data pattern; and d) allocate the first data item to a cache line of a second way having a second way identifier.

In Example 14, the SoC of Example 12, wherein the cache controller is operatively coupled to a main memory and is further to: a) detect a miss within the way tag array for the way address referenced by the memory access request; b) retrieve the first data item from the main memory in response to the miss; c) write the first data item to a first cache line of a plurality of cache lines in a first set and way of the set-associative cache; and d) write a data pattern to second cache lines of the plurality of cache lines of the first set and way, the data pattern indicating that the second cache lines are invalid.

In Example 15, the SoC of Example 11, wherein the memory access request is a read request, and wherein the cache controller is further to, upon detecting that the second data item matches the data pattern, abort a write operation of the second data item to the set-associative cache.

In Example 16, the SoC of Example 11, wherein the cache controller is operatively coupled to a main memory, the processor further comprising a static random-access memory (SRAM) to store a second address that points to a third data item in the main memory, wherein the third data item matches the data pattern, and wherein the cache controller is further to: a) mark the second address as non-evictable; and b) in response to the memory access request referencing the second address, use the second data item to respond to the memory access request.

In Example 17, the SoC of Example 11, wherein the cache controller is further to write the data pattern into a plurality of cache lines of a plurality of sets of ways of the set-associate cache responsive to detecting a reset of the processor core, wherein the SoC further comprises a pseudo-random number generator to generate a different data pattern for use after detecting the reset of the processor core.

In Example 18, the SoC of Example 11, wherein the cache controller is further to write the data pattern into a plurality of cache lines of a victimized set and way of the set-associative cache.

Various embodiments may have different combinations of the structural features described above. For instance, all optional features of the processors and methods described above may also be implemented with respect to a system described herein and specifics in the examples may be used anywhere in one or more embodiments Example 19 is a method comprising: a) receiving, by a cache controller from a requestor, a memory access request referencing a memory address of a memory; b) identifying, by the cache controller, a cache entry associated with the memory address; c) responsive to determining that a first data item stored in the cache entry matches a data pattern indicating cache entry invalidity, reading, by the cache controller, a second data item from a memory location identified by the memory address; and d) returning, to the requestor, a response comprising the second data item.

In Example 20, the method of Example 19, wherein the memory access request is a read request, the method further comprising, responsive to detecting that the second data item matches the data pattern, aborting a write operation of the second data item to the memory.

In Example 21, the method of Example 19, further comprising: a) storing a second address in a static random-access memory (SRAM), wherein the second address points to a third data item in the memory that matches the data pattern; b) marking, within the SRAM, the second address as non-evictable; and c) using, by the cache controller, the third data item to respond to the memory access request in response to the memory access request containing the second address.

In Example 22, the method of Example 19, further comprising: a) generating, using a pseudo-random number generator, a different data pattern for use after detecting a reset of a processing device in which is located the cache controller; and b) writing, by the cache controller, the different data pattern into a plurality of cache lines of a plurality of sectors of the memory, responsive to detecting the reset of the processing device.

In Example 23, the method of Example 19, further comprising writing the data pattern into a plurality of cache lines of a victimized sector of the memory.

In Example 24, the method of Example 19, further comprising: a) detecting, by the cache controller, a miss within a sector tag array for a sector address referenced by the memory access request; b) retrieving, by the cache controller, the first data item from the memory in response to the miss; c) writing, by the cache controller, the first data item to a first cache line of a plurality of cache lines in a first sector of the memory; and d) writing, by the cache controller, a data pattern to second cache lines of the plurality of cache lines of the first sector, the data pattern indicating that the second cache lines are invalid.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to determining validity of data in cache lines of a sector-based cache in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the above examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus comprising:
   a processor core; and
   a cache controller operatively coupled to the processor core, wherein the cache controller is to:
      receive, from a requestor, a memory access request referencing a memory address of a memory, wherein the memory access request is a read request;
      identify a cache entry associated with the memory address;
      responsive to determining that a first application data item stored in the cache entry matches a data pattern indicating cache entry invalidity, read a second application data item from a memory location identified by the memory address;
      return, to the requestor, a response comprising the second application data item; and
      abort a write operation of the second application data item to the cache entry in response to detection that the second application data item matches the data pattern.

2. An apparatus comprising:
   a cache controller to:
      receive, from a requestor, a memory access request referencing a memory address of a memory;
      identify a cache entry associated with the memory address;
      responsive to determining that a first application data item stored in the cache entry matches a data pattern indicating cache entry invalidity, read a second application data item from a memory location identified by the memory address; and return, to the requestor, a response comprising the second application data item;

a static random-access memory (SRAM) coupled to the cache controller and to store a second address that points to a third application data item in the memory, wherein the third application data item matches the data pattern, and wherein the cache controller is further to:

mark the second address as non-evictable; and in response to the memory access request referencing the second address, use the third application data item to respond to the memory access request.

3. The apparatus of claim 1, wherein the memory comprises a plurality of sectors each of which includes a plurality of cache lines, and wherein the cache controller is further to:

parse the memory access request to determine a sector address and a cache line location of a cache line comprising the cache entry; and responsive to determining that an address tag identifying a sector of the plurality of sectors matches the sector address, read the first application data item from the cache line of the sector.

4. The apparatus of claim 3, further comprising a tag cache to store a sector tag array comprising address tags for the plurality of sectors and corresponding valid bits indicating sector-level validity for the plurality of sectors.

5. The apparatus of claim 3, wherein the cache controller is further to write the data pattern into the plurality of cache lines of the plurality of sectors responsive to detecting a processor reset.

6. The apparatus of claim 5, further comprising a pseudo-random number generator to generate a different data pattern for use after detecting the processor reset.

7. The apparatus of claim 3, wherein the cache controller is further to write the data pattern into the plurality of cache lines of a victimized sector of the plurality of sectors.

8. The apparatus of claim 3, wherein the memory is a set-associative cache in which the sector corresponds to a set and a way of a plurality of sets of ways of the set-associative cache.

9. The apparatus of claim 3, wherein the cache controller is further to:

detect a miss within a sector tag array for the sector address referenced by the memory access request;

retrieve the first application data item from the memory in response to the miss;

write the first application data item to a first cache line of a plurality of cache lines in a first sector of the plurality of sectors; and write a data pattern to second cache lines of the plurality of cache lines of the first sector, the data pattern indicating that the second cache lines are invalid.

10. A system on a chip (SoC) comprising:

a processor core; and a cache controller operatively coupled to the processor core and to allocate to a cache line within a set and a way of a set-associative cache, wherein the cache controller is to, responsive to a memory access request, which comprises a read request, received from the processor core:

parse the memory access request to determine a set index portion, a way address, and a cache line location comprising a cache entry associated with a memory address of the memory access request;

determine a set and a way within the set associative cache from, respectively, the set index portion and the way address;

access, using the cache line location, a cache line of the set and way;

responsive to determining that a first application data item stored in the cache line matches a data pattern indicating cache entry invalidity, read a second application data item from a memory location identified by the memory address;

return, to the processor core, a response comprising the second application data item; and abort a write operation of the second application data item to the set-associative cache in response to detection that the second application data item matches the data pattern.

11. The SoC of claim 10, further comprising a local cache to store a way tag array, and wherein the cache controller is further to detect, within the way tag array, a match with the way address, wherein the way address corresponds to the way of the set.

12. The SoC of claim 11, wherein the cache controller is operatively coupled to a main memory, wherein the data pattern further includes a first way identifier of the way, and wherein the cache controller is further to:

detect a miss within the way tag array for the way address referenced by the memory access request;

retrieve the first application data item from the main memory in response to the miss;

detect that the first application data item as stored in the main memory matches the data pattern; and allocate the first application data item to a cache line of a second way having a second way identifier.

13. The SoC of claim 11, wherein the cache controller is operatively coupled to a main memory and is further to:

detect a miss within the way tag array for the way address referenced by the memory access request;

retrieve the first application data item from the main memory in response to the miss;

write the first application data item to a first cache line of a plurality of cache lines in a first set and way of the set-associative cache; and write a data pattern to second cache lines of the plurality of cache lines of the first set and way, the data pattern indicating that the second cache lines are invalid.

14. The SoC of claim 10, wherein the cache controller is operatively coupled to a main memory, the processor further comprising a static random-access memory (SRAM) to store a second address that points to a third application data item in the main memory, wherein the third application data item matches the data pattern, and wherein the cache controller is further to:

mark the second address as non-evictable; and in response to the memory access request referencing the second address, use the second application data item to respond to the memory access request.

15. The SoC of claim 10, wherein the cache controller is further to write the data pattern into a plurality of cache lines of a plurality of sets of ways of the set-associate cache responsive to detecting a reset of the processor core, wherein the SoC further comprises a pseudo-random number generator to generate a different data pattern for use after detecting the reset of the processor core.

16. The SoC of claim 10, wherein the cache controller is further to write the data pattern into a plurality of cache lines of a victimized set and way of the set-associative cache.

17. A method comprising:
receiving, by a cache controller from a requestor, a memory access request referencing a memory address of a memory, wherein the memory access request is a read request;
identifying, by the cache controller, a cache entry associated with the memory address;
responsive to determining that a first application data item stored in the cache entry matches a data pattern indicating cache entry invalidity, reading, by the cache controller, a second application data item from a memory location identified by the memory address;
returning, to the requestor, a response comprising the second application data item; and
aborting a write operation of the second application data item to the cache entry in response to detecting that the second application data item matches the data pattern.

18. The method of claim 17, further comprising:
storing a second address in a static random-access memory (SRAM), wherein the second address points to a third application data item in the memory that matches the data pattern;
marking, within the SRAM, the second address as non-evictable; and
using, by the cache controller, the third application data item to respond to the memory access request in response to the memory access request containing the second address.

19. The method of claim 17, further comprising:
generating, using a pseudo-random number generator, a different data pattern for use after detecting a reset of a processing device in which is located the cache controller; and
writing, by the cache controller, the different data pattern into a plurality of cache lines of a plurality of sectors of the memory, responsive to detecting the reset of the processing device.

20. The method of claim 17, further comprising writing the data pattern into a plurality of cache lines of a victimized sector of the memory.

21. The method of claim 17, further comprising:
detecting, by the cache controller, a miss within a sector tag array for a sector address referenced by the memory access request;
retrieving, by the cache controller, the first application data item from the memory in response to the miss;
writing, by the cache controller, the first application data item to a first cache line of a plurality of cache lines in a first sector of the memory; and
writing, by the cache controller, the data pattern to second cache lines of the plurality of cache lines of the first sector, the data pattern indicating that the second cache lines are invalid.

* * * * *